(12) United States Patent
Lee et al.

(10) Patent No.: US 11,201,108 B2
(45) Date of Patent: Dec. 14, 2021

(54) SEMICONDUCTOR PACKAGE MOUNTED SUBSTRATE

(71) Applicant: SAMSUNG ELECTRONICS CO., LTD., Suwon-si (KR)

(72) Inventors: Ki Ju Lee, Suwon-si (KR); Gyo Young Jung, Su-won-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 301 days.

(21) Appl. No.: 16/291,060

(22) Filed: Mar. 4, 2019

(65) Prior Publication Data

US 2020/0035589 A1 Jan. 30, 2020

(30) Foreign Application Priority Data

Jul. 24, 2018 (KR) .......................... 10-2018-0085962

(51) Int. Cl.
*H01L 23/498* (2006.01)
*H01L 23/552* (2006.01)
(Continued)

(52) U.S. Cl.
CPC ...... *H01L 23/49816* (2013.01); *H01L 23/552* (2013.01); *H01L 24/14* (2013.01);
(Continued)

(58) Field of Classification Search
CPC .............................................. H01L 23/49816
See application file for complete search history.

(56) References Cited

U.S. PATENT DOCUMENTS

| 5,955,789 A | 9/1999 | Vendramin |
| 6,125,042 A | 9/2000 | Verdi et al. |

(Continued)

FOREIGN PATENT DOCUMENTS

| KR | 10-0282027 B1 | 2/2001 |
| KR | 10-0319495 B1 | 1/2002 |

(Continued)

OTHER PUBLICATIONS

Communication dated Feb. 11, 2020 issued by the Taiwan Intellectual Property Office in counterpart Taiwan Application No. 108106177.

(Continued)

*Primary Examiner* — Mounir S Amer
(74) *Attorney, Agent, or Firm* — Sughrue Mion, PLLC

(57) ABSTRACT

A semiconductor package mounted board includes a printed circuit board on which a plurality of first pads and a plurality of second pads are disposed on one surface, and a semiconductor package disposed on the one surface of the printed circuit board and including a plurality of third pads and a plurality of fourth pads. A plurality of first electrical connection structures electrically connect the plurality of first pads and the plurality of third pads, and one or more second electrical connection structures electrically connect the plurality of second pads and the plurality of fourth pads. The plurality of first pads are disposed to correspond to and overlap/align with the plurality of third pads from each other, and the plurality of second pads are disposed to be staggered and offset with respect to the plurality of fourth pads.

20 Claims, 20 Drawing Sheets

(51) Int. Cl.
 *H01L 23/00* (2006.01)
 *H05K 3/34* (2006.01)
(52) U.S. Cl.
 CPC ........ *H05K 3/3436* (2013.01); *H01L 2924/14* (2013.01); *H01L 2924/3025* (2013.01); *H05K 2201/10734* (2013.01)

(56) References Cited

U.S. PATENT DOCUMENTS

| | | |
|---|---|---|
| 6,285,079 B1 | 9/2001 | Kunikiyo |
| 9,337,137 B1 | 5/2016 | Mills |
| 2013/0049224 A1 | 2/2013 | Sutardja |
| 2015/0371964 A1* | 12/2015 | Cha .................. H01L 24/14 257/737 |
| 2017/0287825 A1 | 10/2017 | Lee et al. |
| 2018/0096968 A1 | 4/2018 | Lee et al. |
| 2018/0138029 A1 | 5/2018 | Kim et al. |

FOREIGN PATENT DOCUMENTS

| | | |
|---|---|---|
| KR | 10-2014-0060317 A | 5/2014 |
| KR | 10-2017-0112363 A | 10/2017 |
| KR | 10-2018-0037529 A | 4/2018 |
| TW | M478317 U | 5/2014 |
| TW | 201820568 A | 6/2018 |

OTHER PUBLICATIONS

Communication dated Nov. 10, 2019 , issued by the Korean Intellectual Property Office in counterpart Korean Application No. 10-2018-0085962.

* cited by examiner

SEMICONDUCTOR PACKAGE MOUNTED SUBSTRATE

CROSS-REFERENCE TO RELATED APPLICATION(S)

This application claims benefit of priority to Korean Patent Application No. 10-2018-0085962 filed on Jul. 24, 2018 in the Korean Intellectual Property Office, the disclosure of which is incorporated herein by reference in its entirety.

BACKGROUND

1. Field

The present disclosure relates to a semiconductor package mounted substrate on which a semiconductor package is mounted and disposed on a printed circuit board.

2. Description of Related Art

Due to remarkable advances in information technology (IT) fields such as mobile communications, semiconductors, networks, and the like, market demand for products in which various functions are integrated into a single component or terminal is rapidly growing in the areas of wireless communications, data communications, games, and the like. Accordingly, surface mounting techniques for mounting a package on a board using solder balls or lands have been widely developed.

Electromagnetic interference (EMI) occurring in a package may be shielded somewhat, according to an internal package design. However, when a package is mounted on a printed circuit board (PCB) through solder balls, lands or the like, a space exists between the PCB and the package on which the solder balls, lands or the like are disposed, and there is a limitation in shielding EMI radiating through the space.

SUMMARY

An aspect of the present disclosure is to provide a structure capable of effectively shielding electromagnetic waves radiated through a space between a printed circuit board and a semiconductor package when the semiconductor package is mounted and disposed on the board.

An aspect of the present disclosure is to change a design or disposition of pads of a semiconductor package and/or pads of a printed circuit board connected through an electrical connection structure to form a bridge capable of shielding electromagnetic waves from penetrating between the printed circuit board and the semiconductor package.

For example, a semiconductor package mounted board according to an exemplary embodiment may include a printed circuit board on which a plurality of first pads and a plurality of second pads are disposed on one surface, and a semiconductor package disposed on the one surface of the printed circuit board and including a plurality of third pads and a plurality of fourth pads. A plurality of first electrical connection structures electrically connect the plurality of first pads and the plurality of third pads, and one or more second electrical connection structures electrically connect the plurality of second pads and the plurality of fourth pads. The plurality of first pads may be disposed to correspond to and/or be aligned with the plurality of third pads along a stacking direction, and the plurality of second pads may be disposed to be staggered along the stacking direction with respect to the plurality of fourth pads.

In accordance with a further aspect of the disclosure, a semiconductor package mounted substrate includes a printed circuit board having first and second pluralities of connection pads on a main surface thereof, and a semiconductor package having third and fourth pluralities of connection pads on a main surface thereof. The semiconductor package is mounted on the main surface of the printed circuit board such that the first connection pads overlap with the third connection pads in a stacking direction and are electrically connected to the third connection pads, and such that the second connection pads are offset with respect to the fourth connection pads in the stacking direction and are electrically connected to the fourth connection pads.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
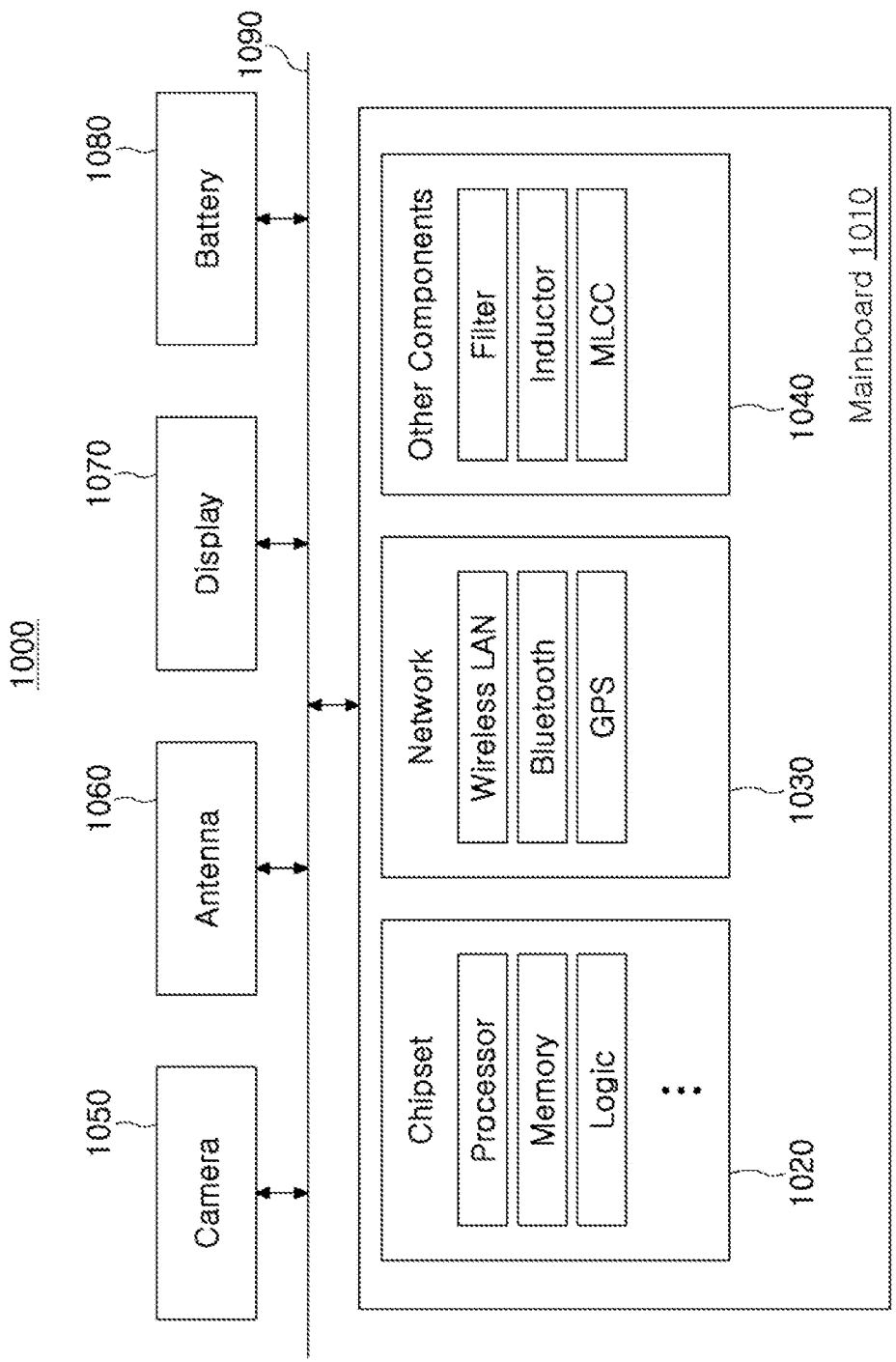
FIG. 1 is a schematic block diagram illustrating an example of an electronic device system.

Hereinafter, embodiments of the present disclosure will be described as follows with reference to the attached drawings. In the drawings, sizes and shapes of elements will be exaggerated or reduced for clear description.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically and/or electrically connected thereto. These components may be coupled to other components to be described later to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multilayer access (CDMA), time division multilayer access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic wave interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
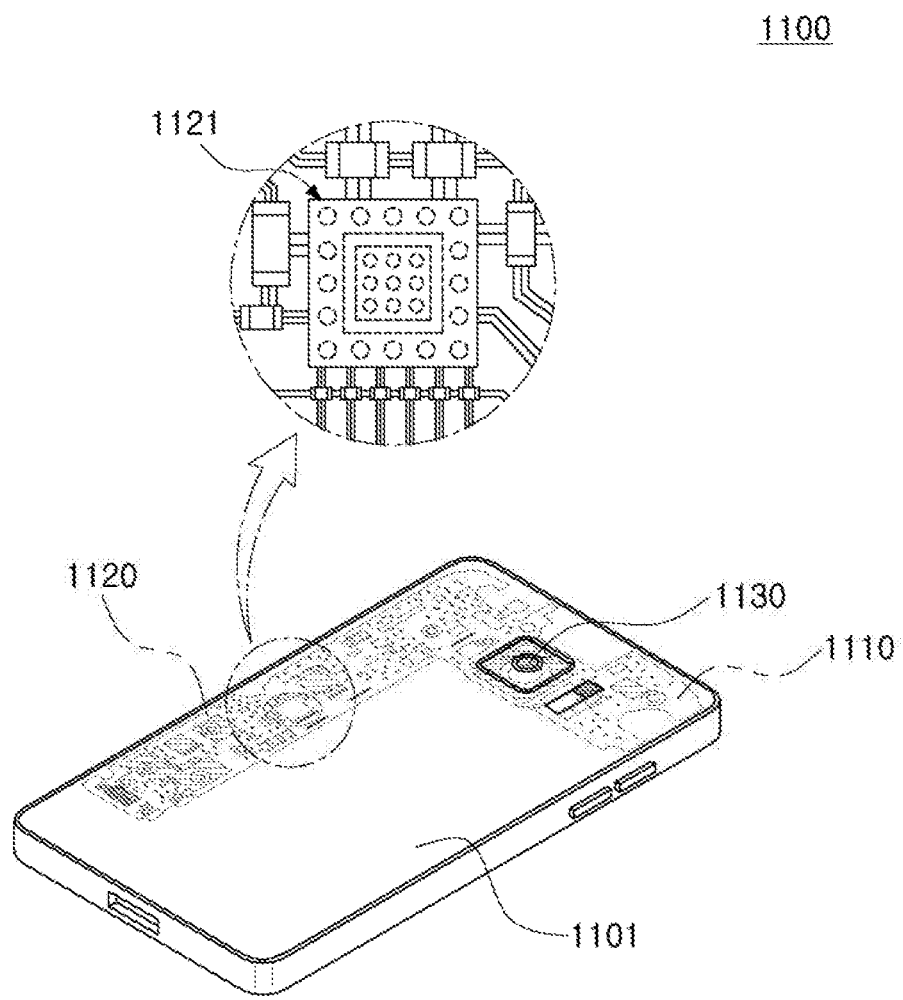
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard may be required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3A:
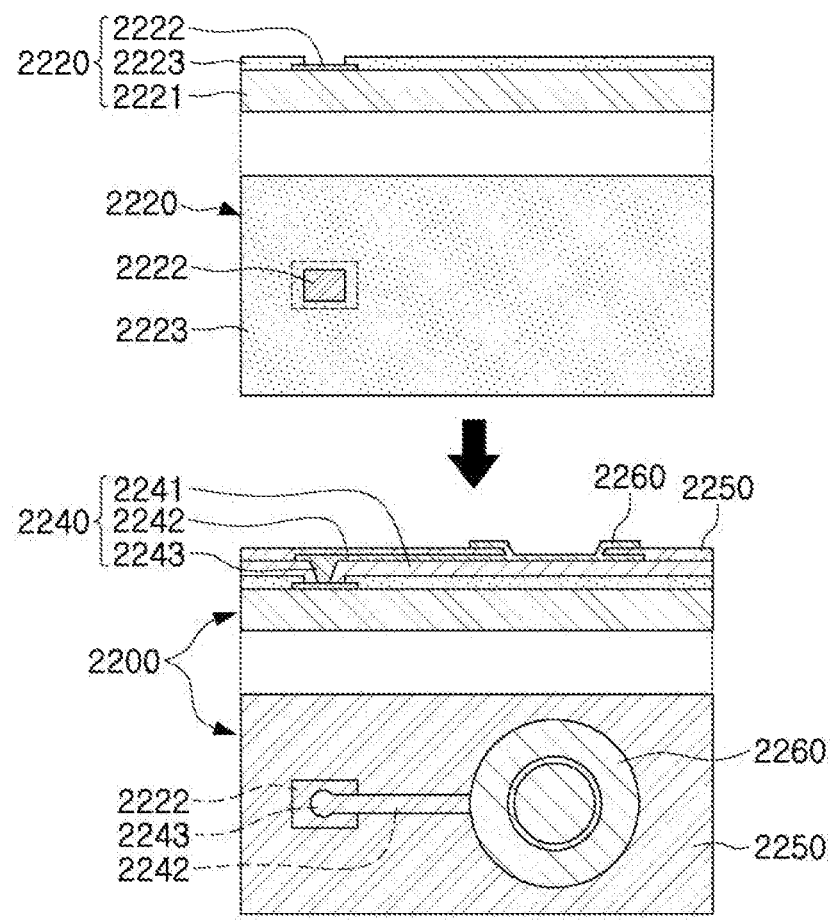
FIGS. 3A and 3B are schematic cross-sectional views illustrating states of a fan-in semiconductor package before and after being packaged.
Figure 3B:
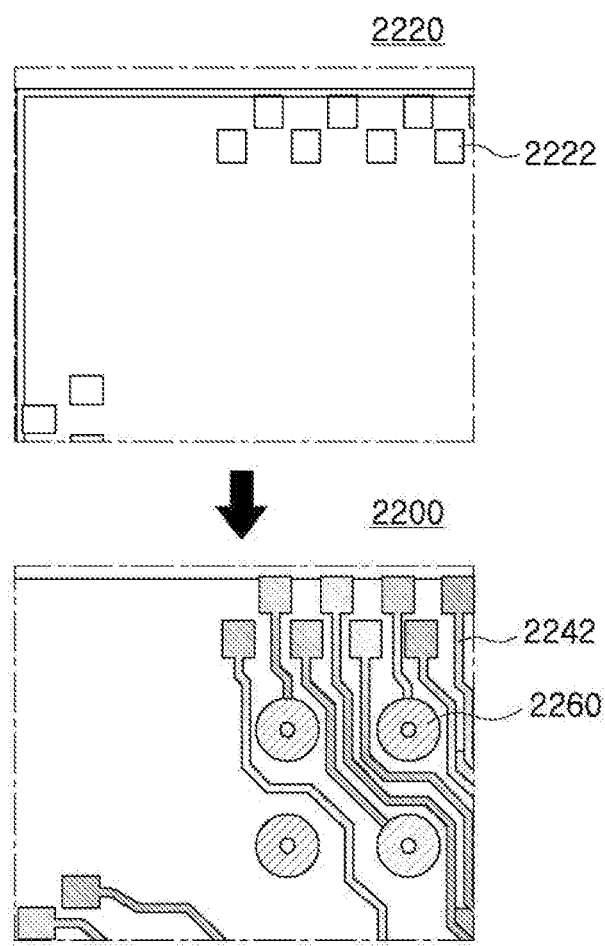

FIGS. 3A and 3B are schematic cross-sectional views illustrating states of a fan-in semiconductor package before and after being packaged.

Figure 4:
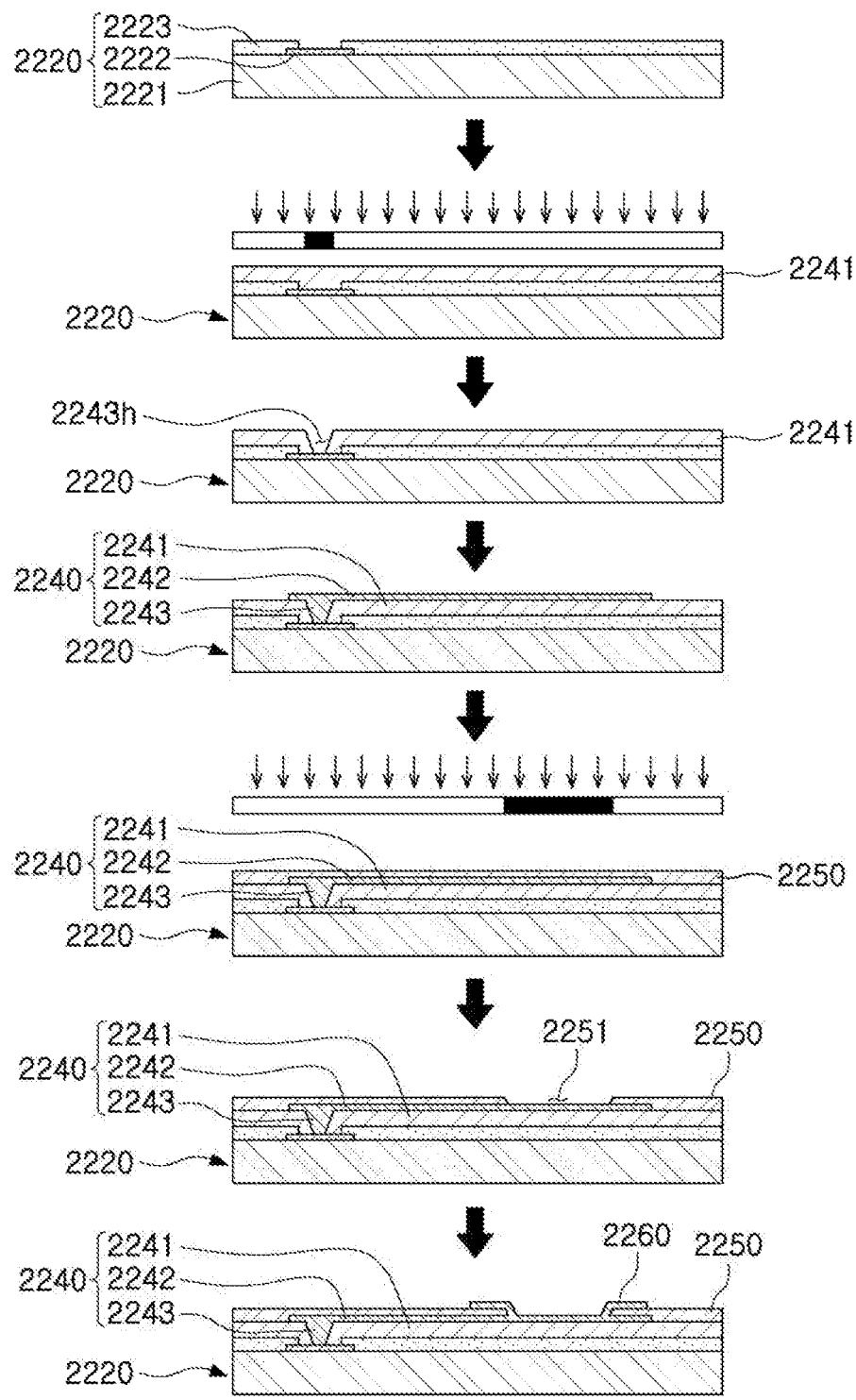
FIG. 4 is a schematic cross-sectional view illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on a mainboard of an electronic device, and the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimageable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, and the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. Particularly, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
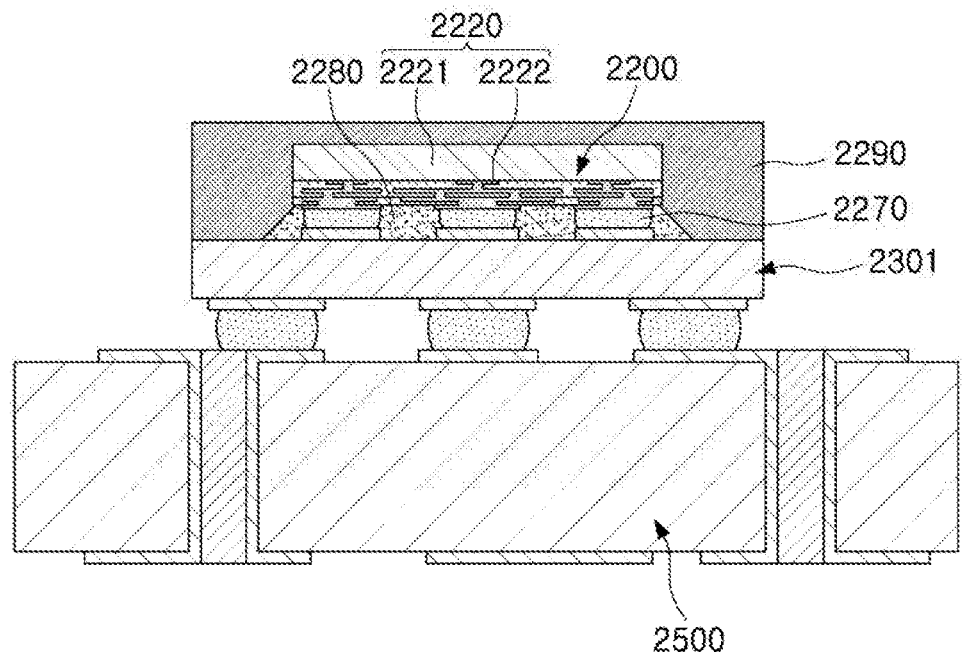
FIG. 5 is a schematic cross-sectional view illustrating a case in which a fan-in semiconductor package is mounted on a ball grid array (BGA) substrate and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
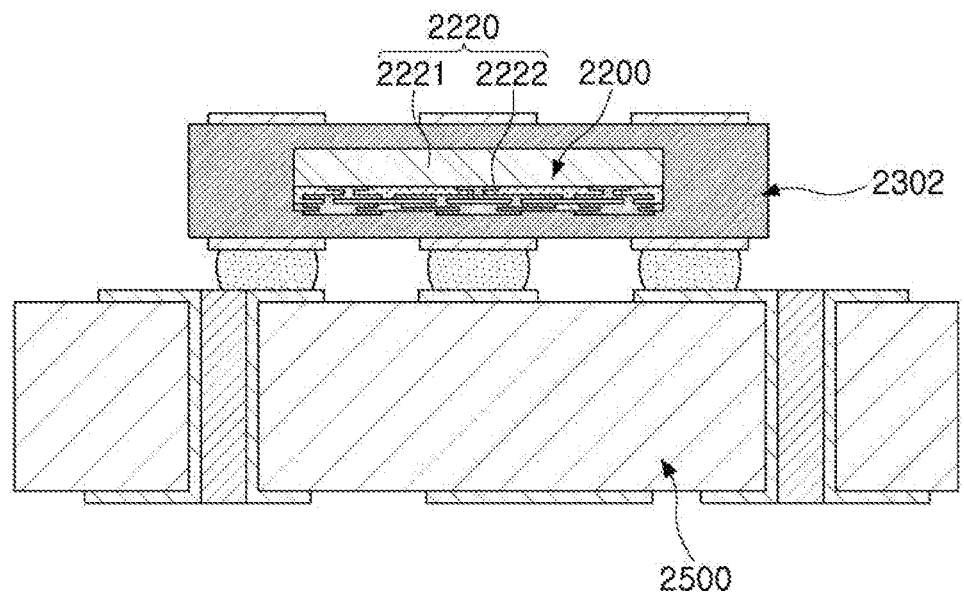
FIG. 6 is a schematic cross-sectional view illustrating a case in which a fan-in semiconductor package is embedded in a BGA substrate and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2301, connection pads 2222, that is, I/O terminals, of the semiconductor chip 2220 may be redistributed by the BGA substrate 2301 in a state in which the fan-in semiconductor package 2200 is embedded in the BGA substrate 2301, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on a printed circuit board such as the separate BGA substrate and be then mounted on the mainboard of the electronic device after going through a packaging process again, or may be mounted and used on the mainboard of the electronic device in a state in which it is embedded in the printed circuit board such as the BGA substrate.

Fan-Out Semiconductor Package

Figure 7:
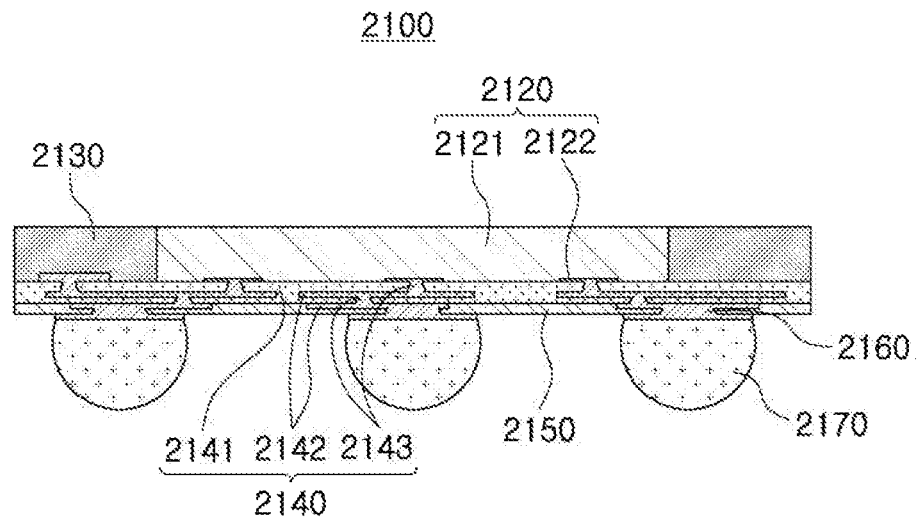
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer portion of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, and the like. The connection structure 2140 may include an insulating layer 2141, redistribution layers 2142 formed on the insulating layer 2141, and vias 2143 electrically connecting the connection pads 2122 and the redistribution layers 2142 to each other.

As such, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
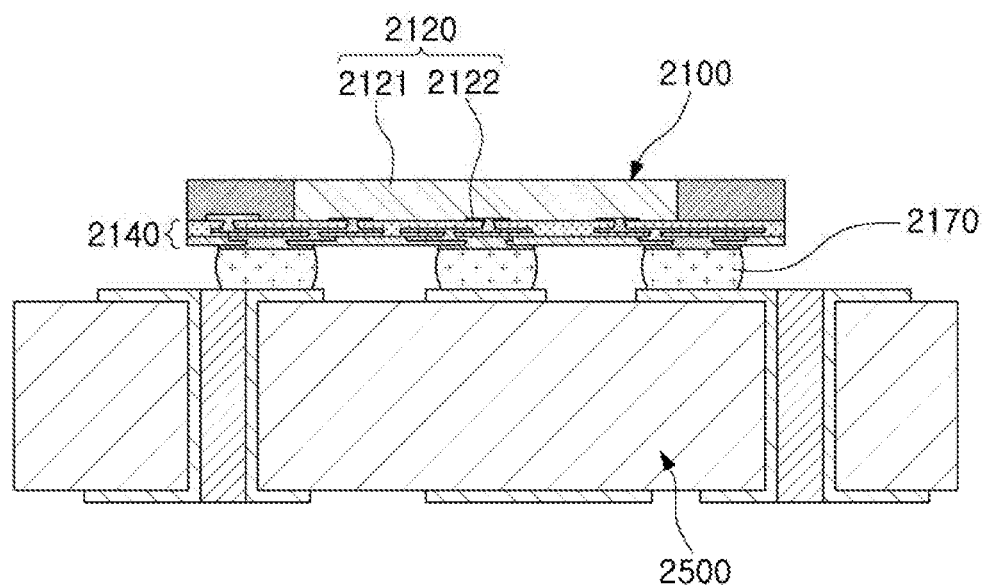
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, and the like. That is, as described above, the fan-out semiconductor package 2100 includes the connection structure 2140 capable of redistributing the connection pads 2122 up to a fan-out area that is beyond a size of the semiconductor chip 2120 on the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate printed circuit board, or the like.

As described above, since the fan-out semiconductor package may be mounted on the mainboard of the electronic device without using a separate printed circuit board, the fan-out semiconductor package may be implemented to have a thickness lower than that of the fan-in semiconductor package using a printed circuit board. Therefore, the fan-out semiconductor package may be miniaturized and thinned. In addition, the fan-out electronic component package has excellent thermal properties and electrical properties, such that it is particularly appropriate for a mobile product. Further, the fan-out electronic component package may be implemented in a more compact form than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, and the like, as described above, and protecting the semiconductor chip from external impacts. The fan-out semiconductor package is a concept different from that of a printed circuit board (PCB) such as a printed circuit board, or the like, having a scale, a purpose, and the like, different from those of the fan-out semiconductor package, and having the fan-in semiconductor package embedded therein.

Semiconductor Package Mounted Board

Figure 9:
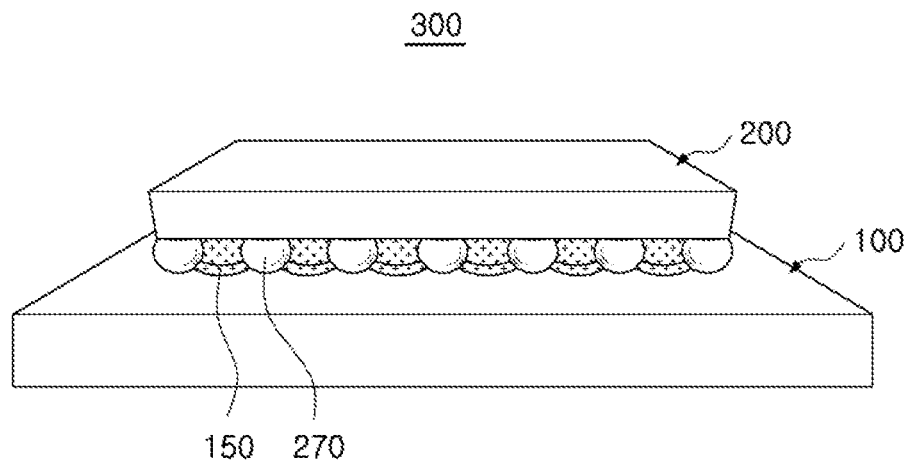
FIG. 9 is a schematic perspective view illustrating an example of a semiconductor package mounted substrate or board.

FIG. 9 is a schematic perspective view illustrating an exemplary embodiment of a semiconductor package mounted board.

Figure 10:
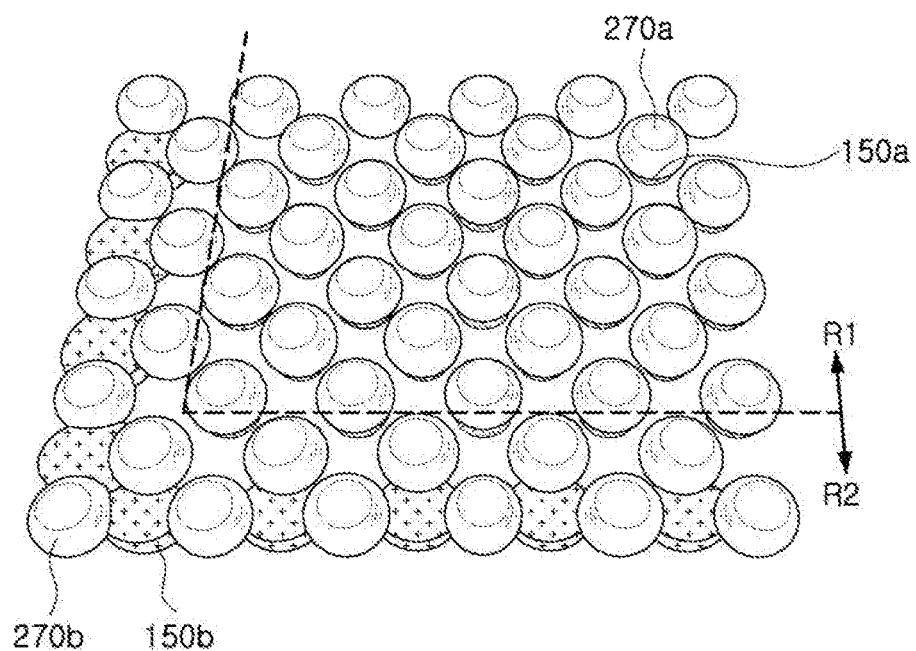
FIG. 10 is a schematic perspective view illustrating a connection form of an electrical connection member disposed on the pad of the semiconductor package of FIG. 9 and an electrical connection member disposed on the pad of the printed circuit board.

FIG. 10 is a perspective view illustrating respective connection forms in which an electrical connection member is disposed on the pad of the semiconductor package of FIG. 9 and an electrical connection member is disposed on the pad of the printed circuit board of the semiconductor package of FIG. 9.

Figure 11:
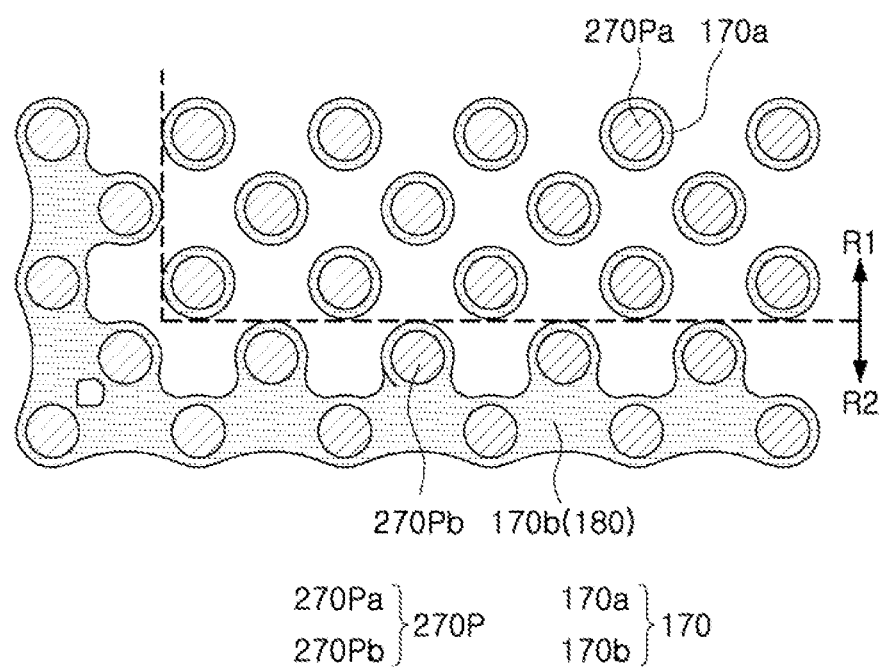
FIG. 11 is a schematic plan view illustrating the connection form of FIG. 10 viewed from above.

FIG. 11 is schematic plan view of the connection form of FIG. 10 viewed from above.

Figure 12:
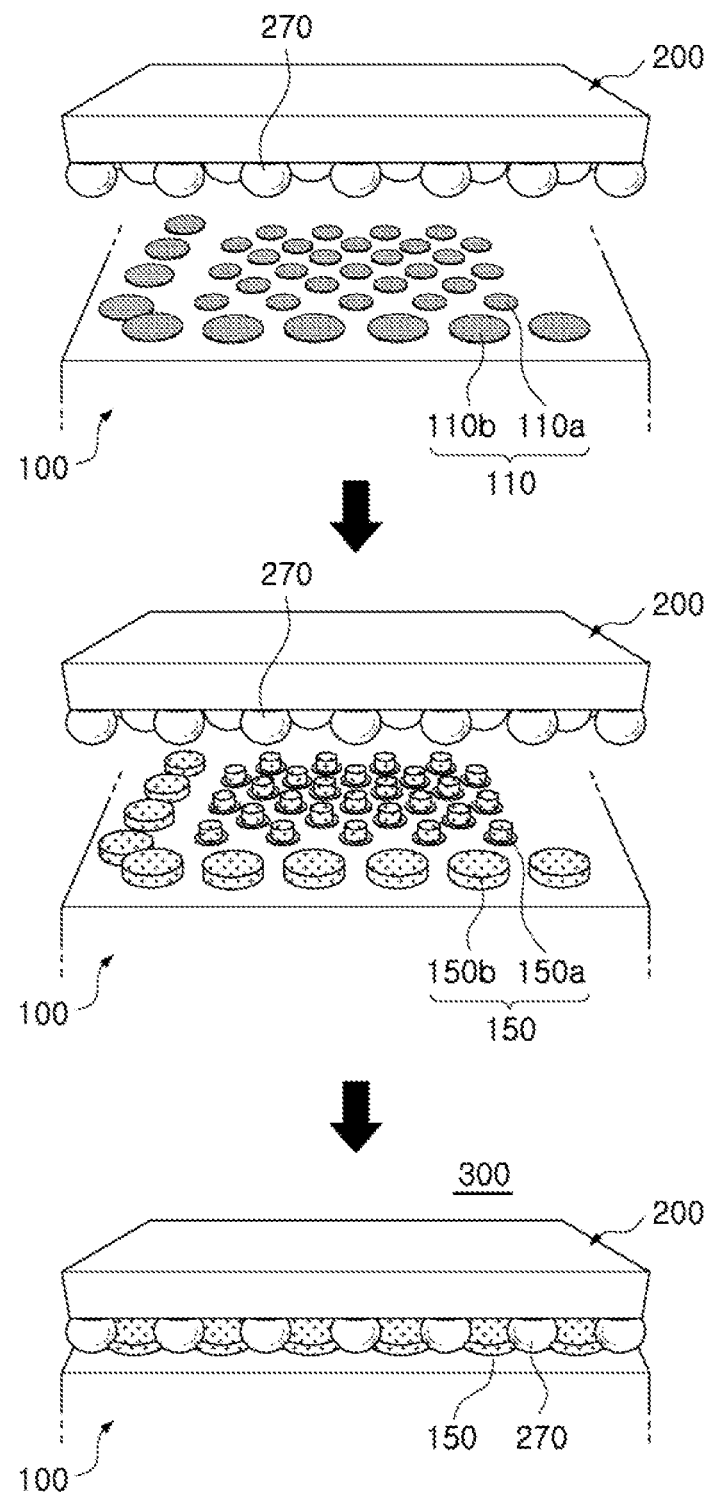
FIG. 12 is a schematic process view illustrating an example of steps for manufacturing the semiconductor package mounted board of FIG. 9.

FIG. 12 is a schematic process view illustrating an example of manufacturing the semiconductor package mounted board of FIG. 9.

Referring to FIGS. 9 to 12, a semiconductor package mounted substrate 300 according to an exemplary embodiment may include a printed circuit board 100 and a semiconductor package 200 disposed on the printed circuit board 100. The printed circuit board 100 may include a plurality of pads 110 on one surface thereof, and a plurality of electrical connection members 150 may be disposed on the plurality of pads 110. The semiconductor package 200 may also include a plurality of pads 270P, and a plurality of electrical connection members 270 may be disposed on the plurality of pads 270P. In this case, second pads 110b of the plurality of pads 110 of the printed circuit board may be disposed to be staggered with respect to fourth pads 270Pb disposed in an outer area R2 of the semiconductor package 200. That is, a design of the second pads 110b of the printed circuit board 100 may be modified such that second electrical connection members 150b disposed thereon may intentionally be disposed to be alternately staggered with respect to the fourth electrical connection members 270b disposed on the fourth pads 270Pb disposed in the outer area R2 of the semiconductor package 200.

Meanwhile, the second electrical connection members 150b of the printed circuit board 100 and the fourth electrical connection members 270b of the semiconductor package 200 may be connected to be staggered with respect to each other to form at least one or more second electrical connection structures 170b electrically connecting the plurality of second pads 110b and the plurality of fourth pads 270b. In this case, the second electrical connection structure 170b may form a bridge 180 for shielding an electromagnetic interference surrounding a first electrical connection structure 170a, and the bridge 180 may have a function of electromagnetic interference shielding. For example, the bridge 180 may continuously block the outer area R2 in a space between the printed circuit board 100 and the semiconductor package 200, thereby effectively shielding electromagnetic waves radiated through the space between the printed circuit board 100 and the semiconductor package 200. That is, the semiconductor package mounted board 300 according to an exemplary embodiment may effectively shield the electromagnetic waves radiated through the space between the printed circuit board 100 and the semiconductor package 200 easily, by simply changing the design of a portion of pads 11Pb of the printed circuit board 100 and/or the design of a portion of pads 270Pb of the semiconductor package 200.

Meanwhile, first pads 110a of the plurality of pads 110 of the printed circuit board 100 may be disposed to correspond to the third pads 270Pa disposed in a central area R1 of the semiconductor package 200. That is, the first pads 110a of the plurality of pads 110 of the printed circuit board 100 may each be aligned with (e.g., vertically aligned with, aligned with in a stacking direction of the semiconductor package 200 on the printed circuit board 100, aligned with in a direction orthogonal to a surface of the PCB 100 and/or semiconductor package 200, or the like) a respective third pad 270Pa disposed in a central area R1 of the semiconductor package 200. In this way, the first electrical connection members 150a disposed on the first pads 110a of the printed circuit board 100 may be independently and individually connected (e.g., in a one-to-one correspondence) to the third electrical connection members 270a disposed on the third pads 270Pa disposed in a central area R1 of the semiconductor package 200. As a result, a plurality of first electrical connection structures 170a electrically connecting the first pad 110a and third pad 270Pa independently and individually (e.g., in a one-to-one manner), respectively being spaced apart from each other which may be surrounded by the electromagnetic interference shielding bridge 180 described above.

Meanwhile, the second electrical connection structure 170b may be electrically connected to a ground pattern of circuits of the printed circuit board 100 and/or the semiconductor package 200. That is, the second pads 110b and the fourth pads 270Pb forming the electromagnetic interference shielding bridge 180 may be ground pads. On the other hand, at least one of the first electrical connection structures 170a may be electrically connected to a signal pattern of circuits of the printed circuit board 100 and/or the semiconductor package 200. That is, at least one first pad 110a and at least one third pad 270Pa may be signal pads.

Meanwhile, the semiconductor package 100 may include a semiconductor chip (not illustrated) having a plurality of connection pads (not illustrated) as described later, and one of the second electrical connection structures 170b may be electrically connected to at least two connection pads (not illustrated). That is, one of the second electrical connection structures 170b may be electrically connected to at least two fourth pads 270Pb as described above, and as a result, it may be electrically connected to at least two connection pads (not illustrated) electrically connected to at least two fourth pads 270Pb.

Meanwhile, the semiconductor package mounted board 300 according to an exemplary embodiment may be manufactured by preparing the printed circuit board 100 and the semiconductor package 200, respectively, forming an electrical connection member 150 using a method such as solder paste printing, or the like, on the pads 110 of the printed circuit board 100, respectively, surface-mounting the semiconductor package 200 on the printed circuit board 100 such that the electrical connection member 270 such as solder balls, or the like, of the semiconductor package 200 is connected to the electrical connection member 150, and performing a reflow process. These electrical connection members 150 and 270 may form an electrical connection structure 170 as a result of the reflow process, and in particular, the second electrical connection structure 170b may form an electromagnetic interference shielding bridge 180 such as a solder dam, as described above.

On the other hand, the pad 270P of the semiconductor package 200 may be a pad of a redistribution layer (not illustrated) as described later, and may be a pad of an underbump metal (not illustrated) when the underbump (not illustrated) is disposed as described later.

Hereinafter, each configuration of the semiconductor package mounted board will be described in more detail with reference to the drawings.

The printed circuit board 100 may be a conventional printed circuit board (PCB). For example, it may be manufactured by building up a circuit pattern and an insulating layer on both sides using a copper clad laminate (CCL) plate. Alternatively, it may be a coreless substrate manufactured using a carrier substrate. As required, it may also be a flexible printed circuit board (FPCB) or a rigid-flexible PCB (RFPCB). The printed circuit board 100 may be a mainboard of an electronic device, but is not limited thereto, and may be a connection board to be connected to the mainboard, or may be a subboard.

The printed circuit board 100 may include a plurality of pads 110 for mounting the semiconductor package 200. The plurality of pads 110 may be disposed on one surface of the printed circuit board 100. The plurality of pads 110 may be a non-solder mask defined (NSMD) type, or a solder mask defined (SMD) type, or a combination thereof, depending on the shape of the opening of the passivation layer. The plurality of pads 110 may include copper (Cu), aluminum (Al), silver (Ag), tin (Sn), gold (Au), nickel (Ni), lead (Pb), titanium (Ti), or alloys thereof, but is not limited thereto.

An electrical connection member 150 may be disposed on each of the plurality of pads 110 of the printed circuit board 100, and the plurality of electrical connection members 150 may be disposed on the plurality of pads 110 of the printed circuit board 100, respectively, and electrically connect them to the plurality of electrical connection members 270 of the semiconductor package 200. The plurality of electrical connection members 150 may be composed of a low meting point metal, for example, tin (Sn) or an alloy containing tin (Sn), respectively. More specifically, it may be a solder paste formed of a solder, or the like, but is not limited thereto.

The semiconductor package 200 may be a conventional wafer level package (WLP). For example, it may be a fan-in semiconductor package or a fan-out semiconductor package described above. As appropriate, the semiconductor package may include a ball grid array substrate. However, it may be a fan-out semiconductor package having structures in which various performances are improved, as described later.

The semiconductor package 200 may be surface-mounted on the printed circuit board 100, and may include a plurality of electrical connection members 270 disposed on the plurality of pads 270P, respectively, for this purpose. The plurality of electrical connection members 270 may be a configuration for physically and/or electrically connecting the semiconductor package 200 to another component. The plurality of electrical connecting members 270 may each be comprised of a low melting point metal, for example, an alloy containing tin (Sn) or tin (Sn). More specifically, it may be a solder ball formed of a solder, or the like, but is not limited thereto. The plurality of electrical connection members 270 may be formed as a multilayer layer structure or a single layer structure. When the plurality of electrical connection members 270 are formed as a multilayer layer structure, a copper pillar and a solder may be included. However, this is merely an example, and the present disclosure is not limited thereto.

Figure 13:
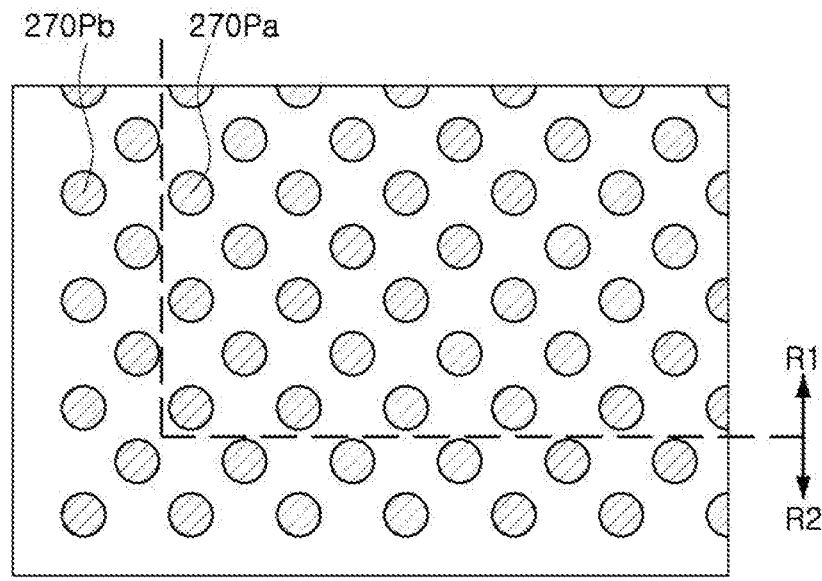
FIG. 13 is a schematic plan view illustrating an example of the design of a pad which may be applied to the semiconductor package of FIG. 9.

FIG. 13 is a schematic plan view illustrating an example of a design of a pad to which may be applied the semiconductor package of FIG. 9.

Figure 14A:
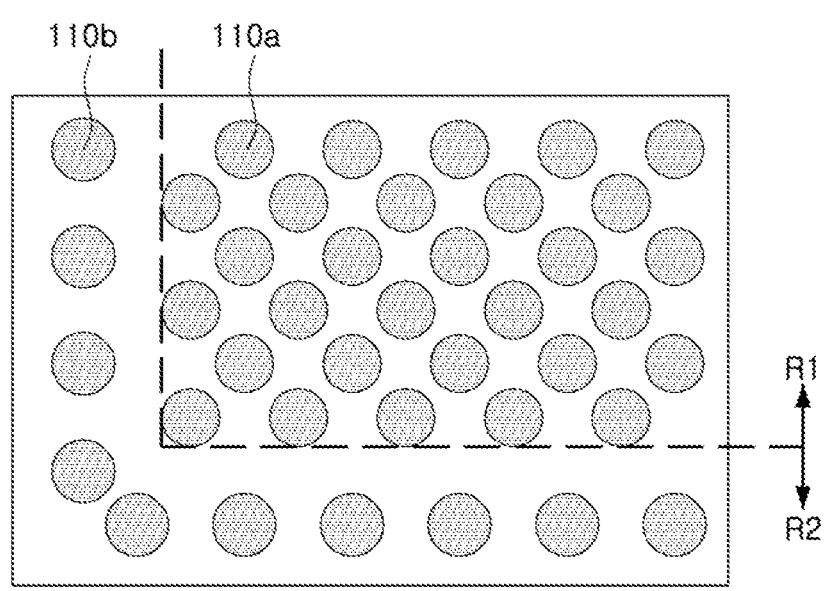
FIGS. 14A, 14B, and 14C are schematic plan views illustrating various examples of designs of pads which may be applied to the printed circuit board of FIG. 9.
Figure 14B:
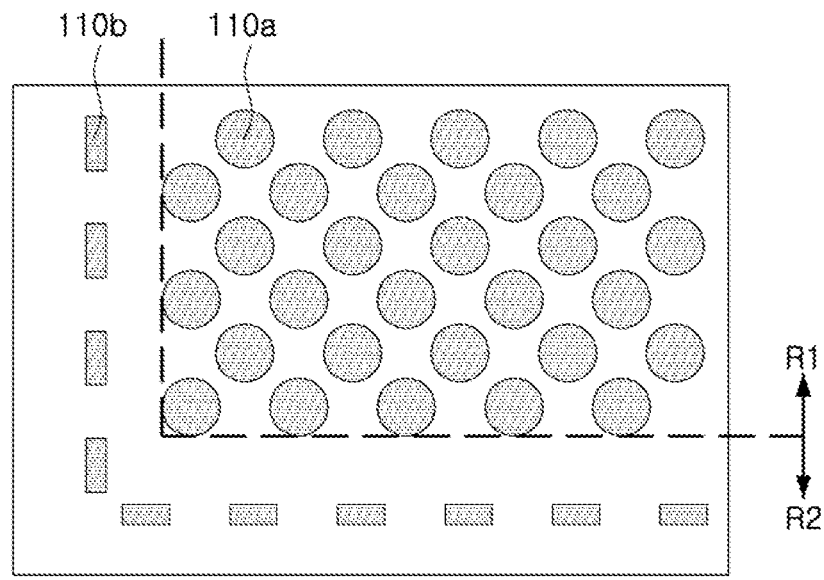
Figure 14C:
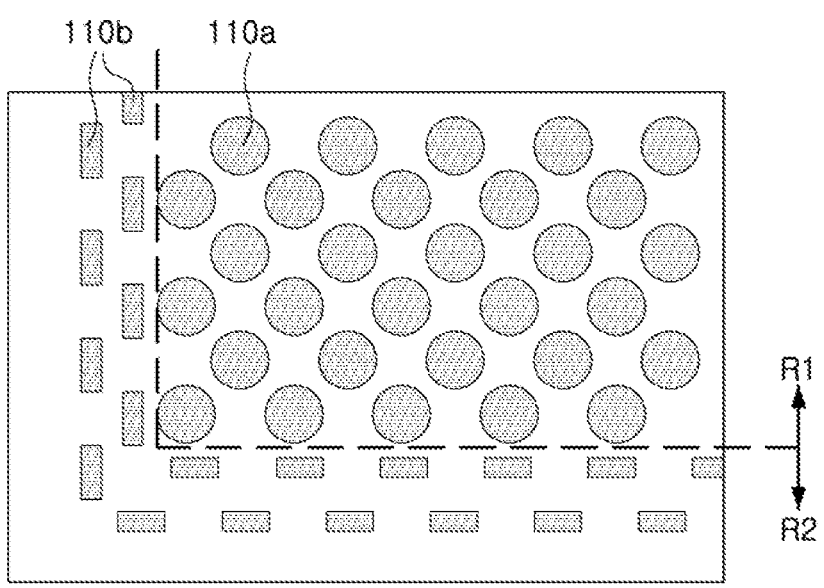

FIGS. 14A, 14B, and 14C are schematic plan views illustrating various examples of designs of pads which may be applied to the printed circuit board of FIG. 9.

Figure 15A:
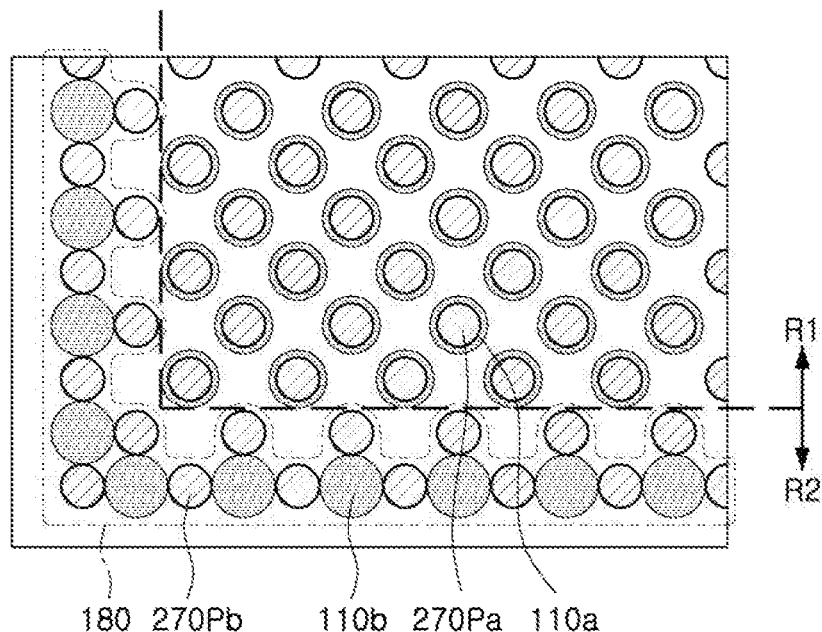
FIGS. 15A, 15B, and 15C are schematic plan views illustrating respective connection forms in which the pad design of the semiconductor package of FIG. 13 and the pad design of the printed circuit board of FIGS. 14A, 14B, and 14C are applied.
Figure 15B:
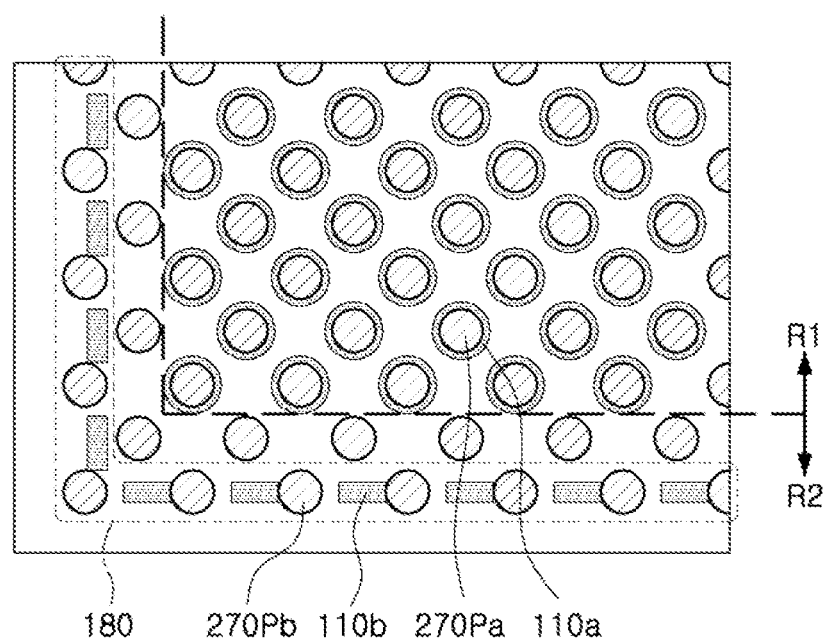
Figure 15C:
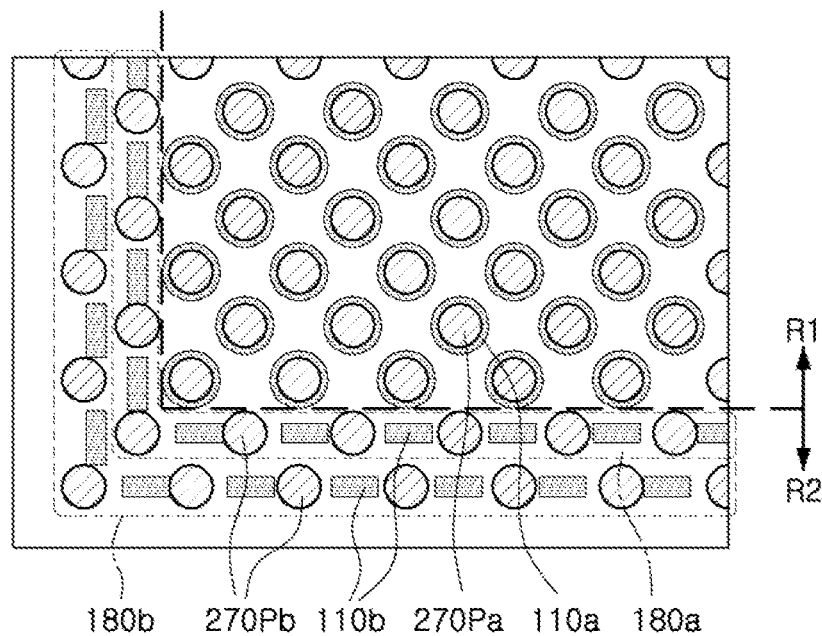

FIGS. 15A, 15B, and 15C are schematic plan views illustrating respective connection forms in the case in which the pad design of the semiconductor package of FIG. 13 and the pad designs of the printed circuit board of FIGS. 14A, 14B, and 14C are applied.

Referring to FIGS. 13, 14A-14C, and 15A-15C, the design of pads 110a and 110b of various types of printed circuit board (not illustrated) may be applied to the design of pads 270Pa and 270Pb of one kind of semiconductor package (not illustrated), such that the electromagnetic interference shielding bridge 180 may be formed. For example, in the case of the semiconductor package (not illustrated), as illustrated in FIG. 13, two rows of fourth pads 270Pb may be disposed on an outer area R2 for the ground, and a plurality of second pads 270Pa, for the signal or the like, may be disposed on an inner area R1. In this case, as illustrated in FIG. 14A, in the case of the printed circuit board (not illustrated), the second pads 110b on an outer area R2 may be designed and disposed in a circular shape so as to fill between the two rows of the fourth pads 270Pb. Alternatively, as illustrated in FIGS. 14B and 14C, the second pads 110b on the outer area R2 of the printed circuit board (not illustrated) may be designed and disposed in a rectangular shape so as to alternate with one or two rows of the fourth pads 270Pb. In either case, the first pads 110a on the inner area R1 do not need to be particularly changed in design. Meanwhile, the pads 270Pa and 270Pb of the semiconductor package (not illustrated) may be pads of a redistribution layer (not illustrated), or may be a pad of an underbump metal (not illustrated) in the case that the underbump metal (not illustrated) is disposed.

As a result, as illustrated in FIGS. 15A, 15B, and 15C, when it is disposed up to the electrical connection member (not illustrated) and performed by a reflow process, the electromagnetic interference shielding bridges 180 described above may be formed. Specifically, the formed electromagnetic interference shielding bridges 180 may continuously surround a central area R1 in which a first electrical connection structure (not illustrated) between the printed circuit board (not illustrated) and the semiconductor package (not illustrated) is formed, as illustrated in FIGS. 15A and 15B. In addition, as illustrated in FIG. 15C, a first bridge 180a may continuously surround the central area R1 in which the first electrical connection structure (not illustrated) between the printed circuit board (not illustrated) and the semiconductor package (not illustrated) is formed, and a second bridge 180b may continuously surround the first bridge 180a and be spaced apart from the first bridge 180a by a predetermined distance in the outer area R2.

Meanwhile, in FIGS. 15A to 15C, one of the second electrical connection structure (not illustrated) may connect the plurality of second pads 110b and the plurality of fourth pads 270Pb disposed to be staggered with respect to each other (e.g., staggered with respect to the stacking direction, the vertical direction, the direction orthogonal to a surface of the PCB 100 and/or semiconductor package 200, or the like).

Figure 16:
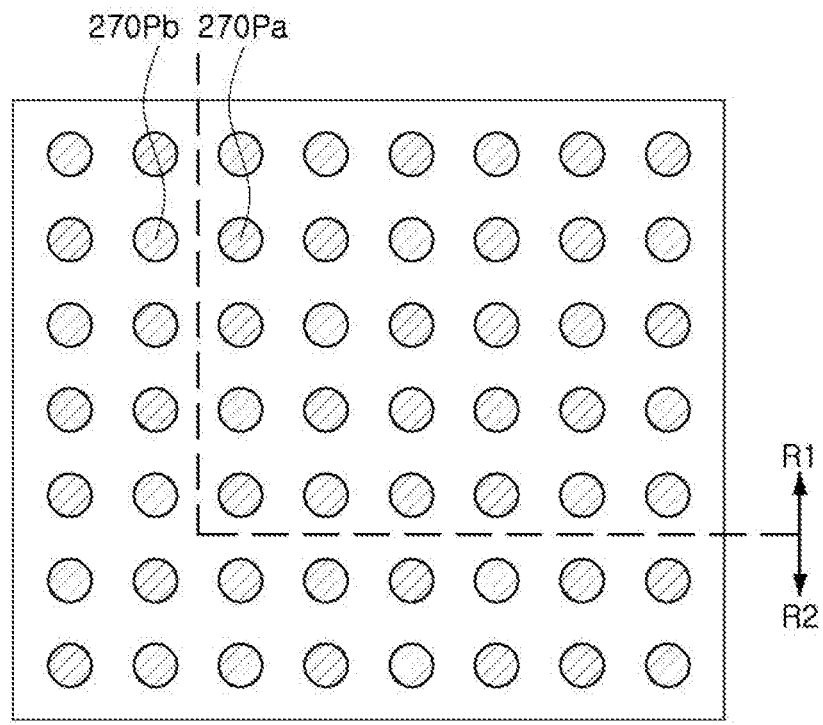
FIG. 16 is a schematic plan view illustrating another example of a design of a pad which may be applied to the semiconductor package of FIG. 9.

FIG. 16 is a schematic plan view illustrating another example of a design of a pad which may be applied to the semiconductor package of FIG. 9.

Figure 17A:
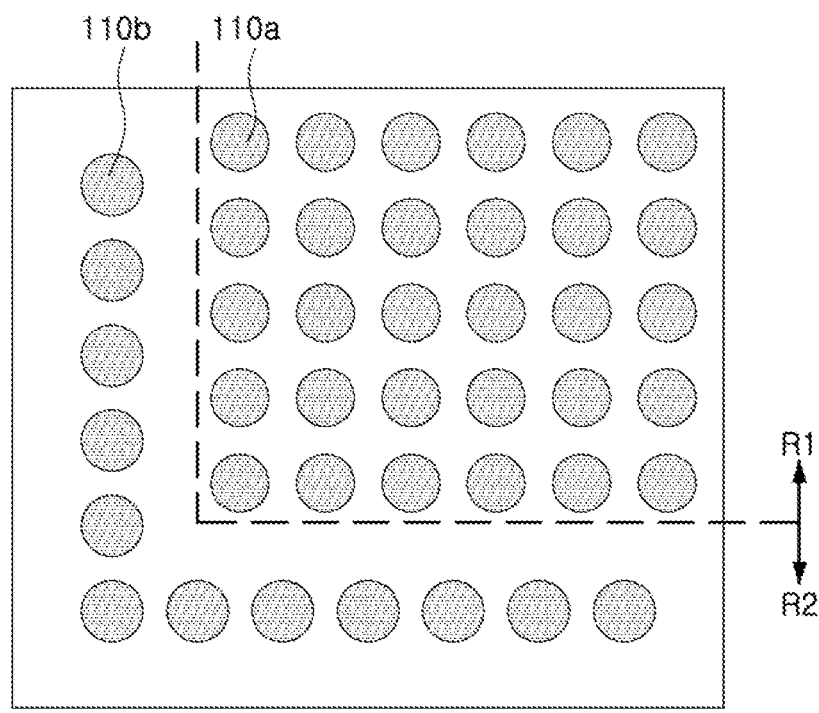
FIGS. 17A, 17B, and 17C are schematic plan views illustrating various other examples of pad designs which may be applied to the printed circuit board of FIG. 9.
Figure 17B:
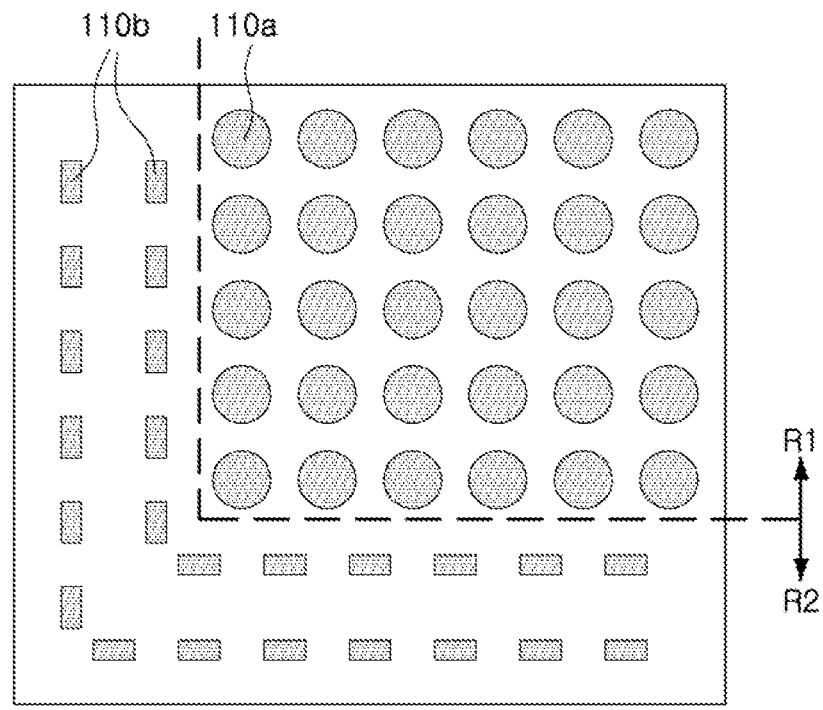
Figure 17C:
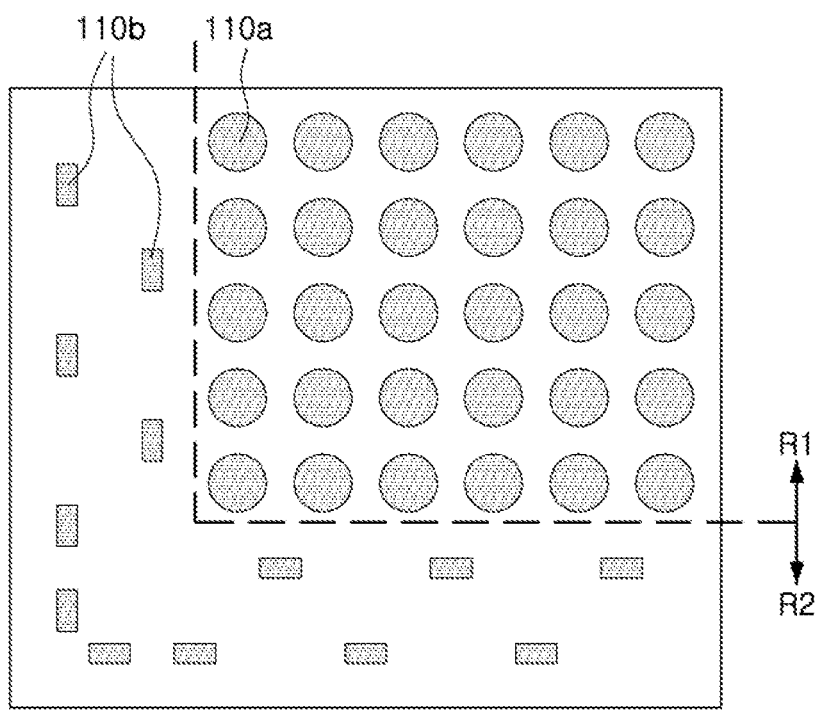

FIGS. 17A, 17B, and 17C are schematic plan views illustrating various other examples of pad designs which may be applied to the printed circuit board of FIG. 9.

Figure 18A:
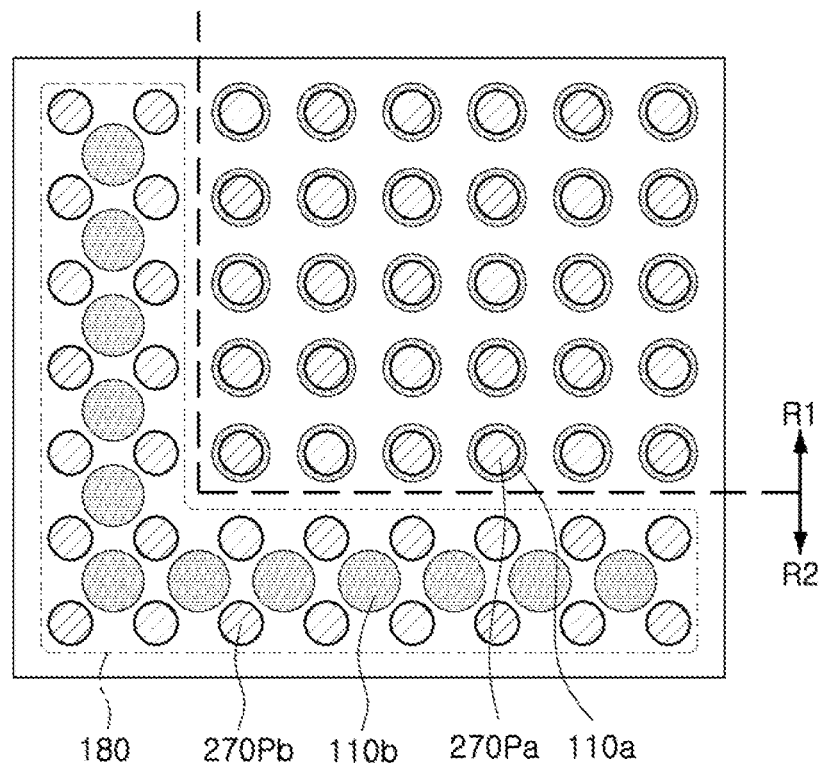
FIGS. 18A, 18B, and 18C are schematic plan views illustrating respective connection forms in which the pad design of the semiconductor package of FIG. 16 is applied and the pad design of the printed circuit board of FIGS. 17A, 17B, and 17C is applied.
Figure 18B:
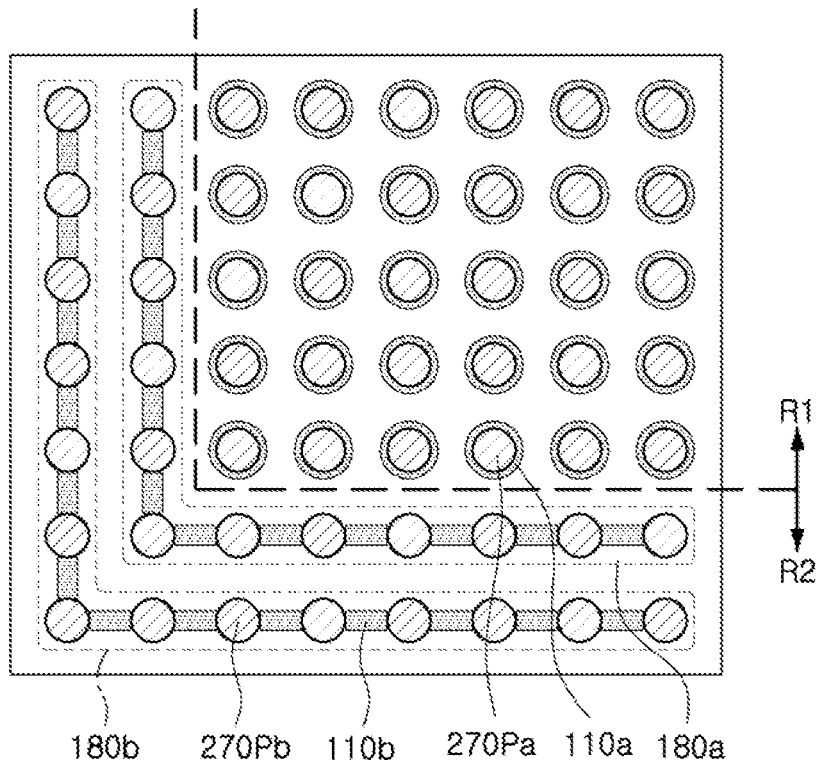
Figure 18C:
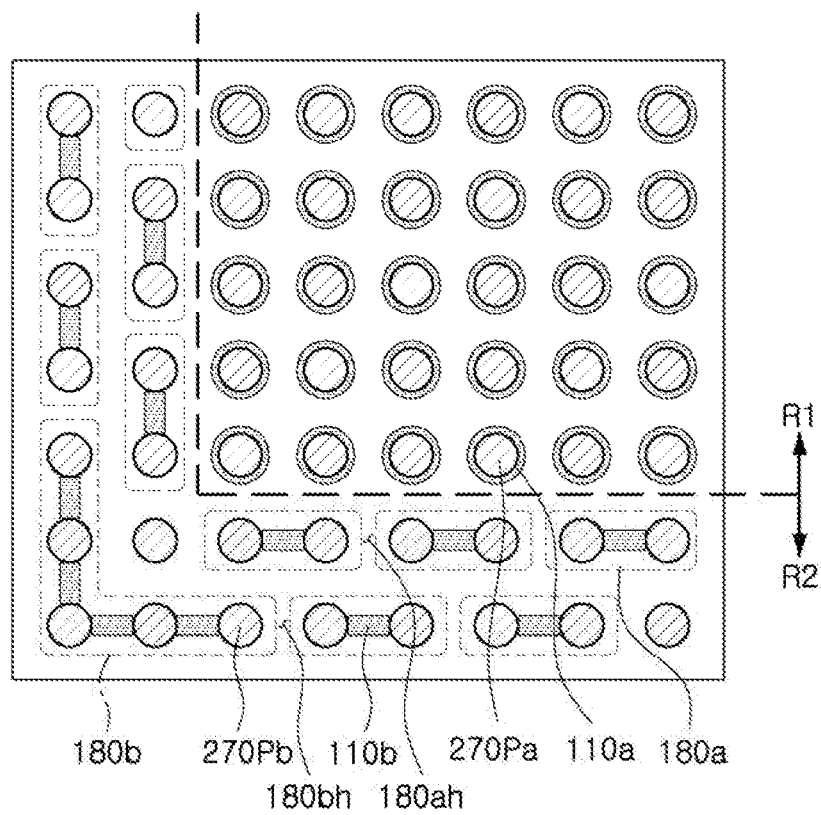

FIGS. 18A, 18B, and 18C are schematic plan views illustrating respective connection forms in a case in which the pad design of the semiconductor package of FIG. 16 and pad designs of the printed circuit board of FIGS. 17A, 17B, and 17C are applied.

Referring to the drawings, similarly, the design of pads 110a and 110b of various kinds of the printed circuit board (not illustrated) may be applied to the design of pads 270Pa and 270Pb of one kind of semiconductor package (not illustrated) to form electromagnetic interference shielding bridges 180 such as those described above. For example, as illustrated in FIG. 16, in the case of a semiconductor package (not illustrated), two rows of fourth pads 270Pb on the outer area R2 may be disposed for the ground, and the plurality of second pads 270Pa may be disposed on the inner area R1 for the signal, or the like. In this case, as illustrated in FIG. 17A, in the case of the printed circuit board (not illustrated), the second pads 110b may designed and disposed in a circular shape so as to fill between the two rows of fourth pads 270Pb. Alternatively, as illustrated in FIGS. 17B and 17C, the second pads 110b may be designed and disposed in a rectangular shape so as to be continuously or discontinuously alternately staggered with respect to the two rows of the fourth pads 270Pb. In either case, the first pads 110a on the inner area R1 do not need to be changed in design. Meanwhile, the pads 270Pa and 270Pb of the semiconductor package (not illustrated) may be pads of a redistribution layer (not illustrated), and a pad of an underbump metal (not illustrated) when the underbump metal (not illustrated) is disposed.

As a result, as illustrated in FIGS. 18A, 18B, and 18C, the electromagnetic interference shielding bridges 180 may be formed by being disposed up to the electrical connection member (not illustrated) and being performed by a reflow process. Specifically, as illustrated in FIG. 18A, the formed electromagnetic interference shielding bridges 180 may continuously surround the central area R1, in which the first electrical connection structure (not illustrated) is formed, between the printed circuit board (not illustrated) and the semiconductor package (not illustrated) in the outer area R2. In addition, as illustrated in FIG. 18B, a first bridge 180a continuously surrounds the central area R1, in which the first electrical connection structure (not illustrated) between the printed circuit board (not illustrated) and the semiconductor package (not illustrated) is provided, and is located in the outer area R2. Additionally, a second bridge 180b continuously surrounds the first bridge 180a and is located in the outer area R2 spaced apart from the first bridge 180a by a predetermined distance. In addition, as illustrated in FIG. 18C, a first bridge 180a can discontinuously surround the central area R1, in which the first electrical connection structure (not illustrated) between the printed circuit board (not illustrated) and the semiconductor package (not illustrated) is provided, and is located in the outer area R2. Additionally, a second bridge 180b discontinuously surrounds the first bridge 180a in the outer area R2 and is spaced apart from the first bridge 180a by a predetermined distance. Discrete gaps 180ah and 180bh may be provided between discontinuous segments of the first bridge 180a and the second bridge 180b, respectively, and the discrete gaps 180ah and 180bh may be staggered or offset with respect to each other along a length direction of the discontinuous segments of the first bridge 180a and the second bridge 180b.

Meanwhile, in FIGS. 18A and 18B, one of the second electrical connection structures (not illustrated) may connect the plurality of second pads 110b and the plurality of fourth pads 270Pb disposed to be staggered with respect to each other. In FIG. 18C, one of the plurality of second electrical connection structure (not illustrated) may connect one of second pads 110b and two forth pads 270Pb disposed to be staggered with respect to each other or a plurality of second pads 110b and a plurality fourth pads 270Pb disposed to be staggered with respect to each other.

Figure 19:
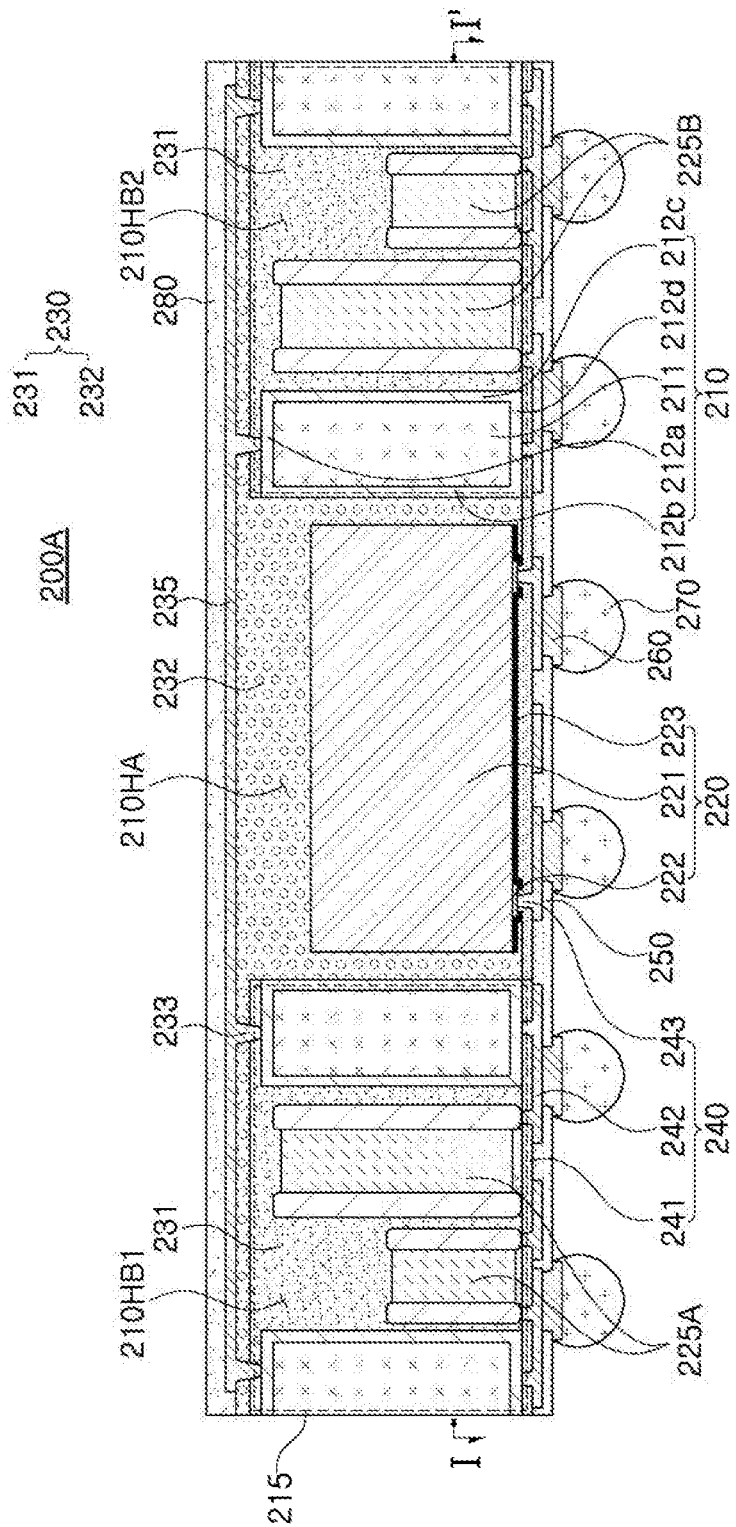
FIG. 19 is a schematic cross-sectional view illustrating an example of the semiconductor package of FIG. 9.

FIG. 19 is a schematic cross-sectional view illustrating an example of the semiconductor package of FIG. 9.

Figure 20:
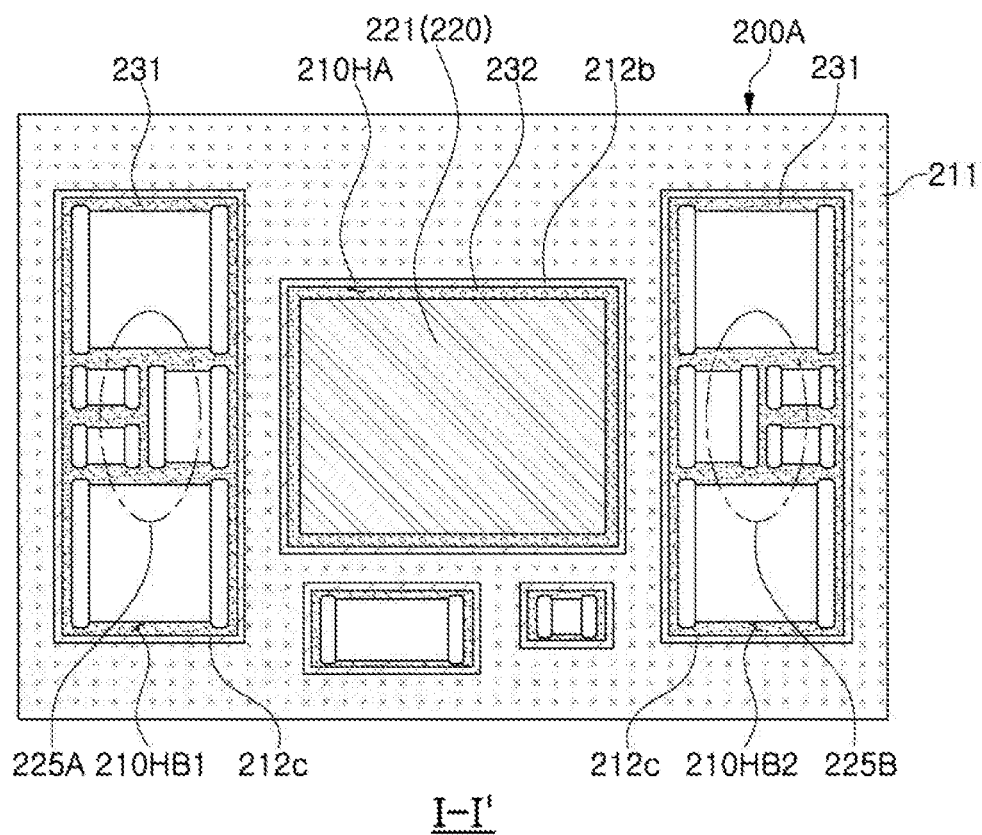
FIG. 20 is a schematic cut-away plan view taken along line I-I' of the semiconductor package of FIG. 19.

FIG. 20 is a schematic cut-away plan view along line I-I' of the semiconductor package of FIG. 19.

Referring to FIGS. 19 and 20, a semiconductor package 200A according to an exemplary embodiment may include a frame 210 including an insulating layer 211 having first and second through holes 210HA, 210HB1, and 210HB2, and first to fourth metal layers 212a, 212b, 212c, and 212d disposed to surround the insulating layer 211, a semiconductor chip 220 disposed in the first through hole 210HA, one or more passive components 225A and 225B disposed in the second through holes 210HB1 and 210HB2, an encapsulant 230 covering at least portions of each of the semiconductor chip 220 and the passive components 225A and 225B and filling at least portions of the first and second through-holes 210HA, 210HB1, and 210HB2, a connection member 240 disposed at lower portions of the frame 210 and the semiconductor chip 220 and the one or more passive components 225A and 225B, a backside metal layer 235 disposed on the encapsulant 230 and covering the semiconductor chip 220 and/or the one or more passive components 225A and 225B, a backside metal via 233 penetrating the encapsulant 230 and connecting the backside metal layer 235 and the insulating layer 211, a passivation layer 250 and an underbump metal 260 and an electrical connection member 270 disposed at the lower portion of the connection member 240, and a cover layer 280.

A semiconductor package 200A according to an exemplary embodiment may basically accommodate a semiconductor chip 220 and one or more passive components 225A and 225B, encapsulate them with the encapsulant 230, and then surround upper areas of the semiconductor chip 220 and the one or more passive components 225A and 225B through the backside metal layer 235 and the backside metal via 233. Therefore, not only electromagnetic waves flowing into or out of the package may be effectively shielded, but also the electromagnetic interference between the semiconductor chip 220 and the one or more passive components 225A and 225B may be effectively shielded. In addition, the insulating layer 211 of the frame 210 may be surrounded by the metal layers 212a, 212b, 212c, and 212d, and particularly, the metal layers 212a and 212c may be disposed on wall surfaces of the through-holes 210HA, 210HB1, and 210HB2 such that the electromagnetic interference shielding effect may be further significantly increased. Also, a thermal radiation effect may be expected through such a structure.

Meanwhile, in a semiconductor package 200A according to an exemplary embodiment, a plurality of passive components 225A and 225B may be disposed in one package together with the semiconductor chip 220 to be modularized. Therefore, an interval between the components may be significantly reduced, such that a mounting surface on the printed circuit board such as the mainboard may be significantly reduced. For example, as the size of display for mobile has recently increased, the necessity of increasing the capacity of the battery has been increased. As the battery capacity increases, the area occupied by the battery becomes larger. Therefore, the area which may be occupied by the module including the PMIC and the passive components accordingly is continuously reduced due to the reduced mounting area of the component. In this case, when the semiconductor package 200A according to an exemplary embodiment is applied to such a module, since the size may be significantly reduced, the narrowed area may be effectively utilized. In addition, the electrical path between the semiconductor chip 220 and the passive components 225A and 225B may be significantly reduced to improve the noise problem.

In addition, the encapsulant 230 may include a first encapsulant 231 covering at least portions of each of the frame 210 and the one or more passive components 225A and 225B and filling at least portions of each of the second through-holes 210HB1 and 210HB2 and a second encapsulant covering at least portions of each of the first encapsulant 231 and the inactive surface of the semiconductor chip 220 and filling at least a portion of the first through-hole 210HA. In this case, an encapsulating process including two or more steps may be performed, instead of a single-step encapsulating process, such that a yield problem of the semiconductor chip 220, due to a poor mounting of the passive components 225A and 225B and an influence of foreign substances generated when the passive components 225A and 225B are mounted may be significantly reduced.

Meanwhile, the semiconductor package 200A according to an exemplary embodiment may include only a semiconductor chip 220 or only passive components 225A and 225B, depending on a field to which the semiconductor package 200A is applied. The semiconductor package 200A according to an exemplary embodiment may be a semiconductor package in the case of including the semiconductor chip 220, and may be a component package in the case of including only the passive components 225A and 225B without the semiconductor chip 220. The first to fourth metal layers 212a, 212b, 212c, and 212d may be selectively formed on the insulating layer 211 of the frame 210. In addition, the passivation layer 250, the underbump metal 260, the cover layer 280, and the like may be selectively omitted.

Hereinafter, each configuration including in the semiconductor package 200A according to an exemplary embodiment will be described in more detail.

The frame 210 may further improve the rigidity of the package 200 depending on the material of the insulating layer 211, and may help secure the thickness uniformity of the encapsulant 230. In the frame 210, the first and second through-holes 210HA, 210HB1, and 210HB2 penetrating the insulating layer 211 may be formed, and the semiconductor chip 220 and one or more passive components 225A and 225B may be disposed in each of the through-holes 210HA, 210HB1, and 210HB2. Each of the through-holes 210HA, 210HB1, and 210HB2 may be formed to surround the semiconductor chip 220 and one or more passive components 225A and 225B, but is not limited thereto.

The frame 210 may include an insulating layer 211. A material of the insulating layer 211 is not particularly limited. For example, the material of the insulating layer 211 may be an insulating material. The insulating material may be a thermosetting resin such as an epoxy resin, a thermoplastic resin such as polyimide, or a resin, in which these resins are impregnated with a core material such as a glass fiber (or a glass cloth or a glass fabric) or the like together with an inorganic filler such as silica, for example, prepreg, Ajinomoto build-up film (ABF), or the like. The insulating layer 211 may be a single layer structure, but may also be a multilayer structure.

The frame 210 may have a first metal layer 212a on an upper surface of the insulating layer 211, a second metal layer 212b on a wall surface of the first through-hole 210HA, a third metal layer 212c on wall surfaces of the second through-holes 210HB1 and 210HB2, and a fourth metal layer 212d on a lower surface of the insulating layer 211. Each of the first to fourth metal layers 212a, 212b, 212c, and 212d may include copper (Cu), aluminum (Al), silver (Ag), tin (Sn), gold (Au), nickel (Ni), lead (Pb), titanium (Ti) or alloys thereof, but a material thereof is not limited thereto. Electromagnetic interference shielding and thermal radiation of the semiconductor chip 220 and one or more passive components 225A and 225B may be performed through the first to fourth metal layers 212*a*, 212*b*, 212*c*, and 212*d*. The first to fourth metal layers 212*a*, 212*b*, 212*c*, and 212*d* may be connected to each other, and may be used as grounds. In this case, the metal layers 212*a*, 212*b*, 212*c*, and 212*d* may be electrically connected to grounds of the redistribution layer 242 of the connection member 240.

The frame 210 may further include a wiring layer (not illustrated) disposed on the upper surface and/or the lower surface of the insulating layer 211 as required. In addition, a through wiring (not illustrated) penetrating the insulating layer 211 and electrically connecting the wiring layer (not illustrated) disposed on the upper and/or lower surfaces of the insulating layer 211. In the case in which the insulating layer 211 has a multilayer structure, a wiring layer (not illustrated) may be disposed between the insulating layers 211. In this case, the through wiring (not illustrated) may be formed of a plurality of connection via layers (not illustrated). The wiring layers (not illustrated) of the frame 210 may be electrically connected to the connection pad 222 of the semiconductor chip 220 and the one or more passive components 225A and 225B.

The frame 210 and the second through-holes 210HB1 and 210HB2 and the one or more passive components 225A and 225B and the first encapsulant 231 may form a core structure 215. In this case, a non-photosensitive insulating layer (not illustrated) such as ABF or the like may be disposed only in a lower area of the core structure 215, and a wiring layer (not illustrated) for primarily redistributing the one or more passive components 225A and 225B may be disposed on a lower surface of the non-photosensitive insulating layer (not illustrated) may be disposed. The wiring layer (not illustrated) may be electrically connected to the one or more passive components 225A and 225B through connection vias (not illustrated) penetrating the non-photosensitive insulating layer.

The semiconductor chip 220 may be an integrated circuit (IC) in which hundreds to millions of devices are integrated into a single chip. The IC may be a power management IC (PMIC), but is not limited thereto. The IC may be a memory chip such as a volatile memory (for example, DRAM), a nonvolatile memory (for example, ROM), a flash memory or the like, an application processor chip such as a central processor (for example, CPU), a graphics processor (for example, GPU), a digital signal processor, a cryptographic processor, a microprocessor, a logic chip such as an analog-to-digital converter, an application-specific integrated circuit (ASIC), or the like.

The semiconductor chip 220 may be a bare integrated circuit in which a separate bump or a wiring layer is not formed, but is not limited thereto. The integrated circuit may be formed, based on an active wafer. In this case, a base material for forming a body 221 of the semiconductor chip 220 may be silicon (Si), germanium (Ge), gallium arsenide (GaAs), or the like. Various circuits may be formed in the body 221. The connection pad 222 may be provided to electrically connect the semiconductor chip 220 to another component and may be formed of a conductive material such as aluminum (Al), but a material thereof is not limited thereto. A passivation film 223 may be disposed on the body 221 to expose the connection pad 222. The passivation film 223 may be an oxide film or a nitride film. Alternatively, the passivation film 223 may be a double layer of oxide/nitride films. An insulating film (not illustrated) and the like may further be provided in other necessary positions. The semiconductor chip 220 has an active surface on which the connection pad 222 is disposed and an inactive surface disposed to oppose to the active surface. In the case in which the passivation film 223 is provided on the active surface of the semiconductor chip 220, a position relationship of the active surface of the semiconductor chip 120 is determined based on a lowermost surface of the passivation film 223.

Each of the passive components 225A and 225B may independently be a capacitor, such as a multilayer ceramic capacitor (MLCC), or a low inductance chip capacitor (LICC), an inductor such as a power inductor, a bead or the like. The passive components 225A and 225B may have thicknesses different from each other. Also the passive components 225A and 225B may have thicknesses different from a thickness of the semiconductor chip 220. In the semiconductor package 200A according to an exemplary embodiment, the passive components 225A and 225B are encapsulated through two or more steps to significantly reduce a defect caused by the thickness variation. The number of the passive components 225A and 225B is not particularly limited, and may be greater or smaller than the number of the passive components shown in the drawings. The passive components 225A and 225B may be electrically connected to the connection pad 222 of the semiconductor chip 220 through the redistribution layer 242 of the connection member 240.

The first encapsulant 231 may encapsulate the respective passive components 225A and 225B, and fills at least a portion of each of the first through-holes 210HB1 and 210HB2. In an exemplary embodiment, the first encapsulant 231 also covers the frame 110. The first encapsulant 231 may include an insulating material. A material including an inorganic filler and an insulating resin, for example, a thermosetting resin such as an epoxy resin, a thermoplastic resin such as polyimide, a resin in which a reinforcing material such as an inorganic filler is impregnated with the resins, or the like, may be used. In detail, an ABF, FR-4, a bismaleimide triazine (BT) resin, or the like, may be used. Also, a molding material such as an epoxy molding compound (EMC) may be used. If necessary, a photoimageable material, for example, a photoimageable encapsulant (PIE) may be used. Also if necessary, a material, in which an insulating resin such as a thermosetting resin or a thermoplastic resin is impregnated with a core material such as an inorganic filler and/or a glass fiber (or a glass cloth or glass fabric), may be used.

The second encapsulant 232 may encapsulate the semiconductor chip 220. Also, the second encapsulant 232 fills at least a portion of the first through-hole 210HA. In an exemplary embodiment, the second encapsulant 232 also covers the frame 210. The second encapsulant 232 also includes an insulating material. A material including an inorganic filler and an insulating resin, for example, a thermosetting resin such as an epoxy resin, a thermoplastic resin such as polyimide, a resin in which a reinforcing material such as an inorganic filler is impregnated with the resins, or the like, may be used. In detail, an ABF, FR-4, a bismaleimide triazine (BT) resin, or the like, may be used. Also a known molding material such as an epoxy molding compound (EMC) may be used. If necessary, a photoresist material, for example, a photoimageable encapsulant (PIE) may be used. Also if necessary, a material, in which an insulating resin such as a thermosetting resin or a thermoplastic resin is impregnated with a core material such as an inorganic filler and/or a glass fiber (or a glass cloth or glass fabric), may be used.

The first encapsulant 231 and the second encapsulant 232 may include the same material and include other materials. Even when the first encapsulant 231 and the second encapsulant 232 include the same material, a boundary therebetween may be confirmed. The first encapsulant 231 and the second encapsulant 232 may include similar materials, but may have different colors. For example, the first encapsulant 231 may be more transparent than the second encapsulant 232. That is, the boundary therebetween may be apparent. As required, the first encapsulant 231 may be formed of an insulating material, and the second encapsulant 232 may be formed of a magnetic material. In this case, the second encapsulant 232 may have an EMI absorption effect. In the case of the semiconductor chip 220, an electrode is not opened through the body 221, such that even when the second encapsulant 232 is formed of a magnetic material, there may be no particular problem.

A backside metal layer 235 may be disposed on the encapsulant 230 to cover the inactive surface of the semiconductor chip 220 and/or one or more passive components 225A and 225B, particularly, on the second encapsulant 232. A backside metal via 233 may penetrate the encapsulant 230, particularly, the first and second encapsulants 231 and 232 and connect to the upper surface of the insulating layer 211 of the frame 210. The backside metal via 233 may contact the upper surface of the insulating layer 211 of the frame 210. The upper surface of the insulating layer 211 connected to the backside metal via 233 may be exposed through a groove portion 212ah of the first metal layer 212a. The backside metal via 233 and/or the groove portion 222ah may have a predetermined path along the upper surface of the insulating layer 211 of the frame 210. upper areas of the semiconductor chip 220 and the one or more passive components 225A and 225B may be surrounded by the metal material through the backside metal layer 235 and the backside metal via 233 such that the electromagnetic interference shielding effect and the thermal radiation effect may be achieved. The backside metal layer 235 and the backside metal via 233 may also include a conductive material such as copper (Cu), aluminum (Al), silver (Ag), tin (Sn), gold (Au), nickel (Ni), lead (Pb), titanium (Ti) or alloys thereof. The backside metal via 233 may have a predetermined path along the upper surface of the insulating layer 211. That is, the backside metal via 233 may be in the form of a line via. In this case, electromagnetic interference shielding may be effectively performed.

The connection member 240 may redistribute the connection pad 222 of the semiconductor chip 220 and may electrically connect the semiconductor chip 220 to the one or more passive components 225A and 225B. Several tens to several hundreds of connection pads 222 of semiconductor chips 220 having various functions may be respectively redistributed through the connection member 240 and may be physically and/electrically connected to an external device, according to the functions. The connection member 240 may include an insulating layer 241 disposed on a lower portion of core structure 215 and the semiconductor chip 220, a redistribution layer 242 disposed on a lower surface of the insulating layer 241, and a connection via 243 penetrating the insulating layer 241 to electrically connect the redistribution layer 242 to the connection pad 222 of the semiconductor chip 220 and/or the one or more passive components 225A and 225B. The insulating layer 241, the redistribution layer 242, and the connection via 243 of the connection member 240 may be formed of a larger number of layers.

An insulating material may be used as a material of the insulating layer 241, and more particularly, a photoimageable dielectric (PID) may be used. When the PID is used, a fine pitch of the connection via 243 may be introduced through a photo-via, several tens to several millions of connection pads 222 of the semiconductor chip 220 may be effectively redistributed.

The redistribution layer 242 may redistribute the connection pad 222 of the semiconductor chip 220 and/or electrodes of the one or more passive components 225A and 225B to be electrically connected to the connection pad 222 of the semiconductor chip 220. A material for forming the redistribution layer 242 may be a conductive material such as copper (Cu), aluminum (Al), silver (Ag), tin (Sn), gold (Au), nickel (Ni), lead (Pb), titanium (Ti), alloys thereof, or the like. The redistribution layer 242 may perform various functions depending on a design. For example, the redistribution layer 242 may include a ground (GND) pattern, a power (PWR) pattern, a signal (S) pattern, or the like. The signal (S) pattern may include various signal patterns, for example, a data signal pattern, or the like, except for the GND pattern, the PWR pattern, and the like. In addition, the redistribution layer 242 may include a via pad, an electrical connection member pad, and the like.

The connection via 243 may electrically connect electrodes of the redistribution layer 242, the connection pad 222, and the passive components 225A and 225B formed on different layers. A material for forming the connection via 243 may be a conductive material such as copper (Cu), aluminum (Al), silver (Ag), tin (Sn), gold (Au), nickel (Ni), lead (Pb), titanium (Ti), alloys thereof, or the like. The connection via 243 may be entirely filled with the conductive material, or the conductive material may be formed along walls of vias. The connection via 243 may have a tapered shape.

The passivation layer 250 may protect the connection member 240 from external physical chemical damage, or the like. The passivation layer 250 may have openings opening at least a portion of the redistribution layer 242 of the connection member 240. The openings may be formed in the passivation layer 250 in several tens to several thousands. The passivation layer 250 may be ABF, but is not limited thereto.

An underbump metal 260 may improve the connection reliability of the electrical connection member 270 and, as a result, improve the board level reliability of the package 200. The underbump metal 260 may be connected to the redistribution layer 242 of the connection member 240 opened through the opening of the passivation layer 250. The underbump metal 260 may be formed in the opening of the passivation layer 250 using a known conductive material, that is, a metal, by a known metallization method, but is not limited thereto.

A portion protruding onto the passivation layer 250 of the underbump metal 260 may function as pads, which the pads may include the third and fourth pads described above. When the underbump metal 260 is omitted, a plurality of pads exposed through the plurality of openings of the passivation layer 250 may be disposed on the lowermost side of the redistribution layer 242, and the pads may include the third and fourth pads described above.

The electrical connection member 270 may be a configuration for physically and/or electrically connecting the semiconductor package 200A externally. The electrical connection member 270 may be composed of a low melting point metal, for example, tin (Sn), or an alloy containing tin (Sn). More specifically, it may be a solder ball formed of a solder, or the like, but is not limited thereto. The electrical connection member 270 may be formed as a multilayer structure or a single layer. In the case of the multilayer structure, a copper pillar and a solder may be included, but is not limited thereto. The number, spacing, and dispositional type of the electrical connection member 270 are not particularly limited and may be sufficiently modified according to design specifications.

At least one of the electrical connection member 270 may be disposed in a fan-out area. The fan-out area means an outer area in which the semiconductor chips 220 is disposed. That is, a semiconductor package 200A according to an exemplary embodiment may be a fan-out semiconductor package. The fan-out semiconductor package may have excellent reliability as compared to a fan-in package, may implement multilayer I/O terminals, and may facilitate a 3D interconnection. In addition, as compared to a ball grid array (BGA) package, a land grid array (LGA) package, or the like, the fan-out package may be manufactured to have a reduced package thickness, and may have price competitiveness.

A cover layer 280 may protect the backside metal layer 235 from external physical chemical damage, or the like. The cover layer 280 may cover at least a portion of the backside metal layer 235. The cover layer 280 may be ABF, but is not limited thereto.

In the present disclosure, the terms "lower portion," "lower surface," and the like, may imply a direction towards a mounting surface of a fan-out semiconductor package, and the terms "upper portion," "upper surface," and the like, may indicate the opposite direction. However, the directions are defined as above for ease of description, and the scope of present disclosure is not particularly limited thereto.

In the present disclosure, the term "connected," or "connecting," may include the case in which components are indirectly connected through an adhesive layer, or the like. Also, "electrically connected," or "electrically connecting," may include the case in which components are physically connected and the case in which components are not physically connected. In addition, the terms "first" and "second" are used to distinguish one component from another, and do not delimit an order and/or importance, and the like, of the components. In some cases, a first component may be referred to as a second component without departing from the scope of rights of the present disclosure, and likewise a second component may be referred to as a first component.

The term "exemplary embodiment" may not necessarily indicate one same exemplary embodiment, but may be provided to emphasize different unique features of the present disclosure. However, it may not necessarily exclude a combination of the suggested exemplary embodiments with another exemplary embodiment. For example, although a description of a certain component in one exemplary embodiment is not provided in another exemplary embodiment, it is to be understood that the description may relate to the other exemplary embodiment unless otherwise indicated in the other exemplary embodiment.

The terms used in the present disclosure are used to describe exemplary embodiments, and are not intended to be limiting. A singular term includes a plural form unless otherwise indicated.

As set forth above, according to the present disclosure, in the case in which a semiconductor package is mountedly disposed on a printed circuit board, a structure is provided for effectively shielding electromagnetic waves radiated through a space between the printed circuit board and the semiconductor package easily, by simply changing a pad design of a semiconductor package connected through an electrical connection structure and/or a pad design printed circuit board.

While exemplary embodiments have been shown and described above, it will be apparent to those skilled in the art that modifications and variations could be made without departing from the scope of the present invention as defined by the appended claims.

What is claimed is:

1. A semiconductor package mounted board comprising:
a printed circuit board on which a plurality of first pads and a plurality of second pads are disposed on one surface;
a semiconductor package disposed on the one surface of the printed circuit board and comprising a plurality of third pads and a plurality of fourth pads;
a plurality of first electrical connection structures electrically connecting the plurality of first pads and the plurality of third pads; and
one or more second electrical connection structures electrically connecting the plurality of second pads and the plurality of fourth pads,
wherein the plurality of first pads are disposed to be aligned, along a stacking direction, with the plurality of third pads, and the plurality of second pads are disposed to be staggered, along the stacking direction, with respect to the plurality of fourth pads.

2. The semiconductor package mounted board of claim 1, wherein one of the second electrical connection structures connects at least one of the plurality of second pads and at least one of the plurality of fourth pads, disposed to be staggered along the stacking direction with respect to each other.

3. The semiconductor package mounted board of claim 2, wherein the semiconductor package comprises a semiconductor chip having connection pads, and one of the second electrical connection structures is electrically connected to at least two connection pads of the semiconductor package.

4. The semiconductor package mounted board of claim 2, wherein one of the second electrical connection structures is electrically connected to a ground pattern of the printed circuit board and a ground pattern of the semiconductor package.

5. The semiconductor package mounted board of claim 1, wherein each of the plurality of first electrical connection structures independently connects a respective one of the plurality of first pads and a respective one of the plurality of third pads disposed to be spaced apart from each other.

6. The semiconductor package mounted board of claim 5, wherein at least one of the plurality of first electrical connection structures is electrically connected to a signal pattern of the printed circuit board and a signal pattern of the semiconductor package.

7. The semiconductor package mounted board of claim 1, wherein the one or more second electrical connection structures form an electromagnetic interference shielding bridge continuously surrounding the plurality of first electrical connection structures.

8. The semiconductor package mounted board of claim 7, wherein the electromagnetic interference shielding bridge comprises a first bridge continuously surrounding the plurality of first electrical connection structures and a second bridge continuously surrounding the first bridge and being spaced apart from the first bridge by a predetermined distance.

9. The semiconductor package mounted board of claim 1, wherein the one or more second electrical connection structures form an electromagnetic interference shielding bridge discontinuously surrounding the plurality of first electrical connection structures.

10. The semiconductor package mounted board of claim 9, wherein the electromagnetic interference shielding bridge comprises a first bridge discontinuously surrounding the plurality of first electrical connection structures and a second bridge discontinuously surrounding the first bridge and being spaced apart from the first bridge by a predetermined distance, and
    discrete gaps between segments of each of the first bridge and the second bridge are staggered with respect to each other.

11. The semiconductor package mounted board of claim 1, wherein the plurality of first electrical connection structures and the one or more second electrical connection structures comprise at least one low melting metal selected from a group consisting tin (Sn) and a tin (Sn)-containing alloy.

12. The semiconductor package mounted board of claim 1, wherein the semiconductor package comprises a semiconductor chip having an active surface on which a plurality of connection pads are disposed and an inactive surface disposed opposite to the active surface, an encapsulant covering at least a portion of the semiconductor chip, a connection member disposed on the active surface of the semiconductor chip and comprising a redistribution layer electrically connected to the plurality of connection pads, and a passivation layer disposed on the plurality of connection pads and having a plurality of openings exposing at least a portion of the redistribution layer.

13. The semiconductor package mounted board of claim 12, wherein the redistribution layer comprises the pluralities of third and fourth pads having at least portions thereof are exposed by the plurality of openings.

14. The semiconductor package mounted board of claim 12, wherein the semiconductor package further comprises a plurality of underbump metals each disposed on a respective opening of the plurality of openings, and comprising a plurality of underbump metals electrically connected to the exposed redistribution layer, and
    the plurality of underbump metals comprise the pluralities of third and fourth pads.

15. The semiconductor package mounted board of claim 12, wherein the semiconductor package further comprises a frame having a through-hole, the semiconductor chip is disposed in the through-hole, and the encapsulant fills at least a portion of the through-hole.

16. The semiconductor package mounted board of claim 15, wherein a metal layer surrounding the semiconductor chip is disposed on a wall surface of the frame and a backside metal layer covering the inactive surface of the semiconductor chip is disposed on the encapsulant.

17. A semiconductor package mounted substrate comprising:
    a printed circuit board having first and second pluralities of connection pads on a main surface thereof;
    a semiconductor package having third and fourth pluralities of connection pads on a main surface thereof,
    a plurality of first connection members each disposed on and overlapping in a stacking direction with a respective second connection pad; and
    a plurality of second connection members each disposed on and overlapping in the stacking direction with a respective fourth connection pad,
    wherein the semiconductor package is mounted on the main surface of the printed circuit board such that the first plurality of connection pads overlap with the third plurality of connection pads in the stacking direction and are electrically connected to the third plurality of connection pads, and such that the second plurality of connection pads are offset with respect to the fourth plurality of connection pads in the stacking direction and are electrically connected to the fourth plurality of connection pads, and
    wherein at least two second connection members contact and electrically connect to a same first connection member of the plurality of first connection members to provide an electrical connection between two of the second plurality of connection pads.

18. The semiconductor package mounted substrate of claim 17, further comprising:
    a plurality of third connection members each disposed between a respective first connection pad and a respective third connection pad to electrically connect the first connection pad to the third connection pad.

19. The semiconductor package mounted substrate of claim 17, wherein the second plurality of connection pads are staggered with respect to the fourth plurality of connection pads in the stacking direction.

20. A semiconductor package mounted substrate comprising:
    a printed circuit board having first and second pluralities of connection pads on a main surface thereof; and
    a semiconductor package having third and fourth pluralities of connection pads on a main surface thereof,
    a plurality of first connection members each disposed on and overlapping in a stacking direction with a respective second connection pad;
    a plurality of second connection members each disposed on and overlapping in the stacking direction with a respective fourth connection pad; and
    a plurality of third connection members each disposed between a respective first connection pad and a respective third connection pad to electrically connect only the respective first connection pad, from among the first plurality of connection pads, and the respective third connection pad, from among the third plurality of connection pads,
    wherein the semiconductor package is mounted on the main surface of the printed circuit board such that the first plurality of connection pads overlap with the third plurality of connection pads in the stacking direction and are electrically connected to the third plurality of connection pads, and such that the second plurality of connection pads are offset with respect to the fourth plurality of connection pads in the stacking direction and are electrically connected to the fourth plurality of connection pads, and
    wherein at least two second connection members contact and electrically connect to a same first connection member of the plurality of first connection members.

* * * * *